United States Patent
Kim et al.

(10) Patent No.: US 11,201,087 B2
(45) Date of Patent: Dec. 14, 2021

(54) SEMICONDUCTOR DEVICE

(71) Applicant: Samsung Electronics Co., Ltd., Suwon-si (KR)

(72) Inventors: Jaemun Kim, Seoul (KR); Gyeom Kim, Hwaseong-si (KR); Seung Hun Lee, Hwaseong-si (KR); Dahye Kim, Yongin-si (KR); Ilgyou Shin, Seoul (KR); Sangmoon Lee, Suwon-si (KR); Kyungin Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/838,089

(22) Filed: Apr. 2, 2020

(65) Prior Publication Data

US 2020/0381251 A1    Dec. 3, 2020

(30) Foreign Application Priority Data

May 31, 2019    (KR) ........................ 10-2019-0064219

(51) Int. Cl.
*H01L 21/8234*     (2006.01)
*H01L 21/02*     (2006.01)
(Continued)

(52) U.S. Cl.
CPC ................ *H01L 21/823431* (2013.01); *H01L 21/02532* (2013.01); *H01L 21/02603* (2013.01); *H01L 21/02664* (2013.01); *H01L 21/30604* (2013.01); *H01L 21/76224* (2013.01); *H01L 29/0649* (2013.01); *H01L 29/0673* (2013.01);
(Continued)

(58) Field of Classification Search
CPC ......... H01L 21/02518; H01L 21/02532; H01L 21/02587; H01L 21/02603; H01L 21/02609; H01L 21/02664; H01L 21/30604; H01L 21/762; H01L 21/76224; H01L 21/823431; H01L 21/823468; H01L 21/8238; H01L 21/823821; H01L 21/823864; H01L 27/085; H01L 27/092; H01L 27/0922; H01L 27/0924; H01L 29/0649; H01L 29/0673; H01L 29/41; H01L 29/42316; H01L 29/42384; H01L 29/42392; H01L 29/66007; H01L 29/66545; H01L 29/66742; H01L 29/785; H01L 29/78618; H01L 29/78696
See application file for complete search history.

(56) References Cited

U.S. PATENT DOCUMENTS 8,513,125 B2    8/2013   Saracco et al.
8,890,207 B2    11/2014   Wu et al.
(Continued)

*Primary Examiner* — Cheung Lee
(74) *Attorney, Agent, or Firm* — Myers Bigel, P.A.

(57) ABSTRACT

A method includes forming an active pattern on a substrate, the active pattern comprising first semiconductor patterns and second semiconductor patterns, which are alternately stacked, forming a capping pattern on a top surface and a sidewall of the active pattern, performing a deposition process on the capping pattern to form an insulating layer, and forming a sacrificial gate pattern intersecting the active pattern on the insulating layer. The capping pattern has a crystalline structure and is in physical contact with sidewalls of the first semiconductor patterns and sidewalls of the second semiconductor patterns.

20 Claims, 32 Drawing Sheets

(51) Int. Cl.
 *H01L 29/06* (2006.01)
 *H01L 29/423* (2006.01)
 *H01L 29/786* (2006.01)
 *H01L 29/66* (2006.01)
 *H01L 21/306* (2006.01)
 *H01L 21/762* (2006.01)

(52) U.S. Cl.
 CPC .. *H01L 29/42392* (2013.01); *H01L 29/66545* (2013.01); *H01L 29/66742* (2013.01); *H01L 29/78618* (2013.01); *H01L 29/78696* (2013.01)

(56) References Cited

U.S. PATENT DOCUMENTS

| | | |
|---|---|---|
| 9,412,849 B1 | 8/2016 | Suk et al. |
| 9,620,590 B1 | 4/2017 | Bergendahl et al. |
| 9,755,017 B1 | 9/2017 | Guillorn et al. |
| 9,947,773 B2 | 4/2018 | Ching et al. |
| 9,966,471 B2 | 5/2018 | Ching et al. |
| 10,164,023 B2 | 12/2018 | Lee et al. |
| 10,763,177 B1* | 9/2020 | Zhang ............. H01L 21/823462 |
| 2015/0333162 A1 | 11/2015 | Bouche et al. |
| 2016/0254382 A1* | 9/2016 | Hoentschel ....... H01L 21/02164 257/401 |
| 2018/0350969 A1 | 12/2018 | Ching et al. |
| 2018/0366465 A1 | 12/2018 | Ching et al. |
| 2018/0366584 A1 | 12/2018 | Huang et al. |
| 2019/0006535 A1 | 1/2019 | Kuwajima et al. |

\* cited by examiner

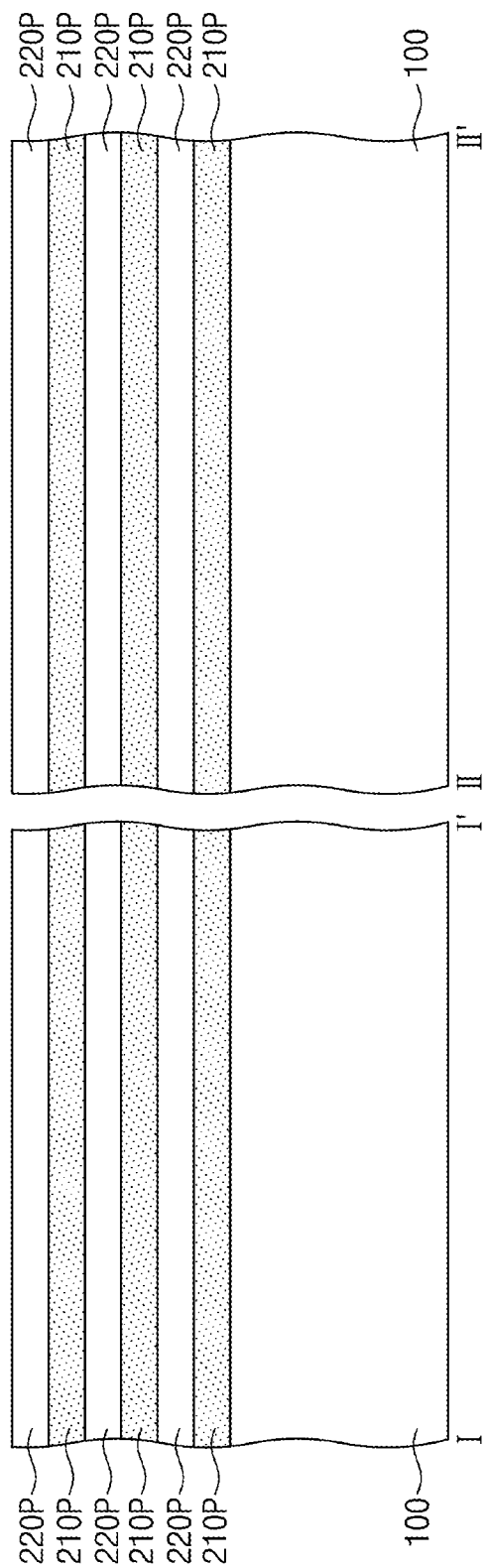

SEMICONDUCTOR DEVICE

CROSS-REFERENCE TO RELATED APPLICATION

This U.S. non-provisional patent application claims priority under 35 U.S.C. § 119 to Korean Patent Application No. 10-2019-0064219, filed on May 31, 2019, in the Korean Intellectual Property Office, the disclosure of which is hereby incorporated by reference in its entirety.

BACKGROUND

Embodiments of the inventive concept relate to a semiconductor device and, more particularly, to a semiconductor device including a field effect transistor and a method of manufacturing the same.

Semiconductor devices are widely used in the electronics industry because of their small sizes, multi-functional characteristics, and/or low manufacturing costs. Semiconductor devices with ever increasing performance characteristics and improved features have been demanded as the electronics industry has developed. To satisfy these demands, semiconductor devices have been highly integrated and structures of semiconductor devices have become more and more complicated.

SUMMARY

Embodiments of the inventive concepts may provide a semiconductor device with improved reliability and a method of manufacturing the same.

In some embodiments of the inventive concept, a method comprises forming an active pattern on a substrate, the active pattern comprising first semiconductor patterns and second semiconductor patterns, which are alternately stacked, forming a capping pattern on a top surface and a sidewall of the active pattern, performing a deposition process on the capping pattern to form an insulating layer, and forming a sacrificial gate pattern intersecting the active pattern on the insulating layer. The capping pattern has a crystalline structure and is in physical contact with sidewalls of the first semiconductor patterns and sidewalls of the second semiconductor patterns.

In some embodiments of the inventive concept, a method comprises forming an active pattern protruding from a substrate, the active pattern comprising first semiconductor patterns and second semiconductor patterns, which are alternately stacked, forming a device isolation pattern on the substrate, an upper portion of the active pattern being free of the device isolation pattern, forming a capping pattern on a top surface and a sidewall of the active pattern, a top surface of the device isolation pattern being free of the capping pattern, forming an insulating layer on the capping pattern and the top surface of the device isolation pattern, and forming a sacrificial gate pattern intersecting the active pattern on the insulating layer. The capping pattern is in physical contact with first sidewalls of the first semiconductor patterns and second sidewalls of the second semiconductor patterns.

BRIEF DESCRIPTION OF THE DRAWINGS

The inventive concepts will become more apparent in view of the attached drawings and accompanying detailed description.

FIGS. 2A to 2L are views illustrating a method of manufacturing a semiconductor device, according to some embodiments of the inventive concept.

DETAILED DESCRIPTION OF THE EMBODIMENTS

Figure 1:
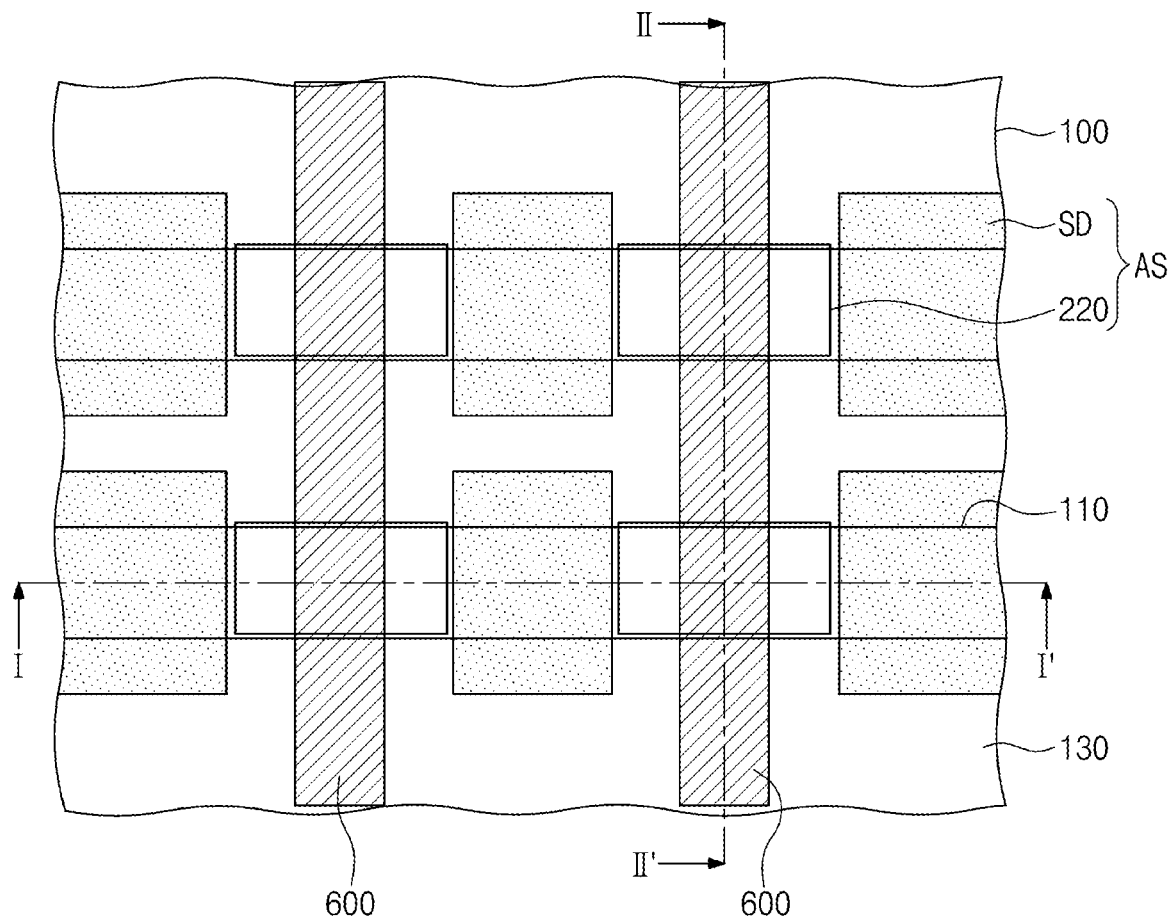
FIG. 1 is a plan view illustrating a semiconductor device according to some embodiments of the inventive concept.

The same reference numerals or the same reference designators may denote the same elements or components throughout the specification. The element or component indicated by the same reference numeral or designator may be formed by the same method unless otherwise noted.

As used herein, the term "and/or" includes any and all combinations of one or more of the associated listed items. It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It is noted that aspects described with respect to one embodiment may be incorporated in different embodiments although not specifically described relative thereto. That is, all embodiments and/or features of any embodiments can be combined in any way and/or combination.

Semiconductor devices and methods of manufacturing the same according to some embodiments of the inventive concept will be described hereinafter.

FIG. 1 is a plan view illustrating a semiconductor device according to some embodiments of the inventive concept. FIGS. 2A to 2L are views illustrating a method of manufacturing a semiconductor device, according to some embodiments of the inventive concept. FIGS. 2A to 2D and 2F to 2L are cross-sectional views taken along lines I-I' and II-II' of FIG. 1. FIG. 2E is an enlarged view of a region 'III' of FIG. 2D.

Referring to FIGS. 1 and 2A, first semiconductor layers 210P and second semiconductor layers 220P may be stacked on a substrate 100. The substrate 100 may be a semiconductor substrate. For example, the substrate 100 may be a silicon substrate, a silicon-germanium substrate, or a silicon-on-insulator (SOI) substrate. The first semiconductor layers 210P and the second semiconductor layers 220P may be formed by performing an epitaxial growth process using the substrate 100 as a seed layer. For example, the epitaxial growth process may be performed by a chemical vapor deposition (CVD) process or a molecular beam epitaxy (MBE) process. The first semiconductor layers 210P and the second semiconductor layers 220P may be continuously formed in the same chamber. That is, the first semiconductor layers 210P and the second semiconductor layers 220P may be formed in situ. The first semiconductor layers 210P and the second semiconductor layers 220P may be conformally grown on an entire surface of the substrate 100, not on a partial region of the substrate 100. The first semiconductor layers 210P and the second semiconductor layers 220P may be alternately and repeatedly stacked on the substrate 100. The number of the first semiconductor layers 210P and the number of the second semiconductor layers 220P may be variously changed in accordance with different embodiments of the inventive concept. The first semiconductor layers 210P may function as sacrificial layers or a channel region of a transistor. Each of the first semiconductor layers 210P may be a germanium-containing layer. For example, each of the first semiconductor layers 210P may include at least one of silicon-germanium (SiGe) and/or germanium (Ge). The first semiconductor layers 210P may further include a dopant. For example, the dopant may include at least one of Al, Ga, Sb, As, In, Ge, Zr, Hf, and/or Ta. For example, each of the first semiconductor layers 210P may be a silicon-germanium (SiGe) layer doped with aluminum (Al). Each of the first semiconductor layers 210P may have a uniform composition ratio. Each of the second semiconductor layers 220P may be a silicon-containing layer, such as a silicon (Si) layer. For example, the second semiconductor layers 220P may include poly-silicon.

Figure 2B:
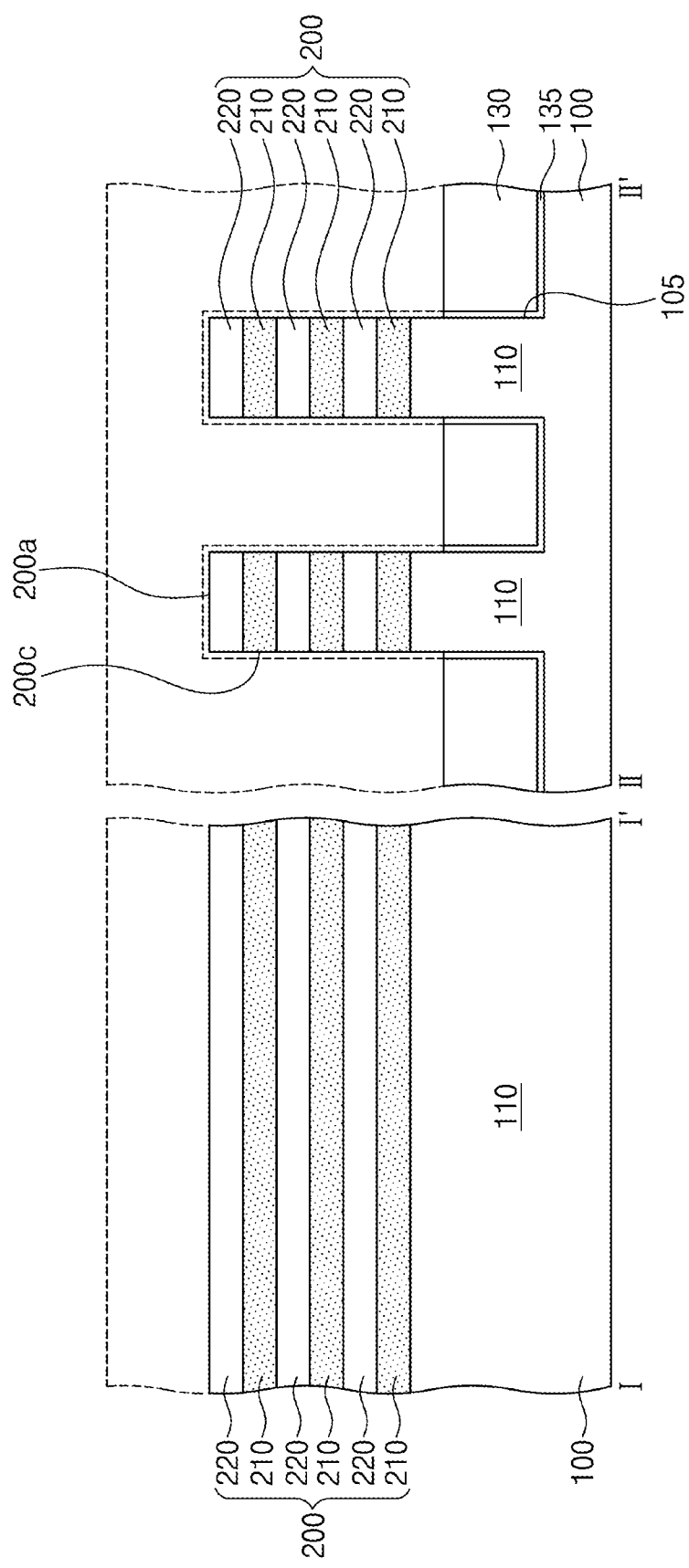

Referring to FIGS. 1 and 2B, a base active pattern 110 and an active pattern 200 may be formed on the substrate 100. The formation of the base active pattern 110 and the active pattern 200 may include patterning the first semiconductor layers 210P, the second semiconductor layers 220P, and an upper portion of the substrate 100 to form trenches 105. The base active pattern 110 and the active pattern 200 may be defined by the trenches 105. Each of the trenches 105 may have a linear shape extending in a first direction D1. The trenches 105 may be spaced apart from each other in a second direction D2. The first direction D1 may be parallel to a bottom surface of the substrate 100. The second direction D2 may be parallel to the bottom surface of the substrate 100 and may be substantially perpendicular to the first direction D1. The active pattern 200 may include first semiconductor patterns 210 and second semiconductor patterns 220. The first semiconductor patterns 210 may be formed by patterning the first semiconductor layers 210P. The second semiconductor patterns 220 may be formed by patterning the second semiconductor layers 220P.

The active pattern 200 may have a linear shape extending in the first direction D1. The first semiconductor patterns 210 and the second semiconductor patterns 220 may be alternately and repeatedly stacked in a direction perpendicular to the bottom surface of the substrate 100. The first semiconductor patterns 210 and the second semiconductor patterns 220 may have linear shapes extending in the first direction D1. A top surface 200a of the active pattern 200 may correspond to a top surface of the uppermost one of the second semiconductor patterns 220. A sidewall 200c of the active pattern 200 may include sidewalls of the first semiconductor patterns 210 and sidewalls of the second semiconductor patterns 220. The base active pattern 110 may be formed by patterning the upper portion of the substrate 100. The base active pattern 110 may have a linear shape extending in the first direction D1, and the active pattern 200 may be formed on a top surface of the base active pattern 110.

Liner patterns 135 and device isolation patterns 130 may be formed in the trenches 105, respectively. The device isolation patterns 130 may be formed on the substrate 100 at both sides of the base active pattern 110. The device isolation patterns 130 may extend in the first direction D1. In some embodiments, a liner layer may be conformally formed on a sidewall of the base active pattern 110 and the top surface 200a and the sidewall 200c of the active pattern 200, as illustrated by a dotted line. The formation of the device isolation patterns 130 may include forming an insulating layer at least partially filling the trenches 105 on the liner layer as illustrated by a dotted line, and recessing the insulating layer to expose the sidewall 200c of the active pattern 200. Top surfaces of the device isolation patterns 130 may be lower than the top surface of the base active pattern 110 as shown in the cross-sectional view of FIG. 2B. The liner layer may be recessed to form the liner patterns 135. The liner patterns 135 may expose at least an upper portion of the active pattern 200. The liner patterns 135 may be disposed between the substrate 100 and the device isolation patterns 130 and between the base active pattern 110 and the device isolation patterns 130. The liner patterns 135 may include, for example, silicon nitride. The device isolation patterns 130 may include an oxide, a nitride, and/or an oxynitride.

Figure 2C:
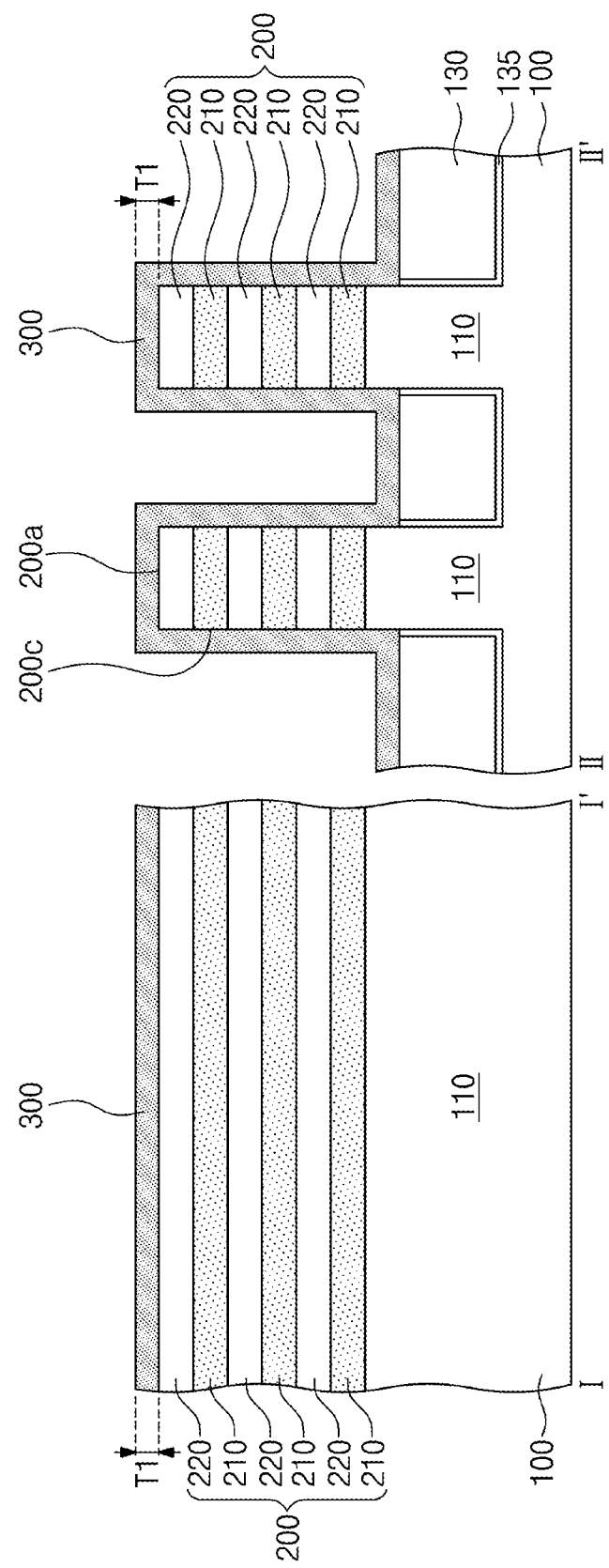

Referring to FIGS. 1 and 2C, a capping pattern 300 may be formed on the top surface 200a and the sidewall 200c of the active pattern 200. The capping pattern 300 may be in physical contact with the top surface of the uppermost one of the second semiconductor patterns 220 and the sidewalls of the first and second semiconductor patterns 210 and 220. Due to the capping pattern 300, the first and second semiconductor patterns 210 and 220 may not be exposed to the outside environment. The capping pattern 300 may include a semiconductor material, e.g., silicon. The capping pattern 300 may not include oxygen in some embodiments. Thus, the first semiconductor patterns 210 may not be oxidized by the capping pattern 300. The capping pattern 300 may not include nitrogen and germanium. As used herein, when a component is described as not including a certain element, it may not include the element or it may include a very small amount of the element within tolerances for one or more processes. For example, the capping pattern 300 may include a different material from that of the first semiconductor patterns 210 and may include the same material as the second semiconductor patterns 220.

In some embodiments, the capping pattern 300 may include an epitaxial pattern. For example, the formation of the capping pattern 300 may be performed by an epitaxial growth process using the first semiconductor patterns 210 and the second semiconductor patterns 220 as a seed layer. For example, the epitaxial growth process may be performed using a silicon-containing gas as a source gas at a temperature of about 300 degrees Celsius to about 950 degrees Celsius. The silicon-containing gas may include monosilane, disilane, trichlorosilane, and/or tetrachlorosilane.

In some embodiments, the capping pattern 300 may have a poly-crystalline structure. For example, the capping pattern 300 may include poly-silicon. In this case, the formation of the capping pattern 300 may be performed by a deposition process. In some embodiments, the deposition process may include forming a seed layer using, for example, di-isopropylamino silane (DIPAS).

The capping pattern 300 may have a first thickness T1, and the first thickness T1 may range from about 5 Å to about 500 Å. If the first thickness T1 is greater than 500 Å, then it may be difficult to form a fine pitch of the semiconductor device.

Before the formation of the capping pattern 300, a cleaning process may be performed on the active pattern 200. For example, the cleaning process may be performed using a mixture (SC1) of $NH_4OH$, $H_2O$ and $O_2$ or using a mixture (SPM) of sulfuric acid ($H_2SO_4$) and hydrogen peroxide ($H_2O_2$). In another example, the cleaning process may be performed using $NF_3$, $F_2$, and/or diluted HF (DHF). In still another example, the cleaning process may be performed by a low-temperature dry cleaning process using plasma, such as a SiConi cleaning process. When the cleaning process is performed, it may be possible to inhibit or prevent interface defects from being formed between the capping pattern 300 and the active pattern 200.

Figure 2D:
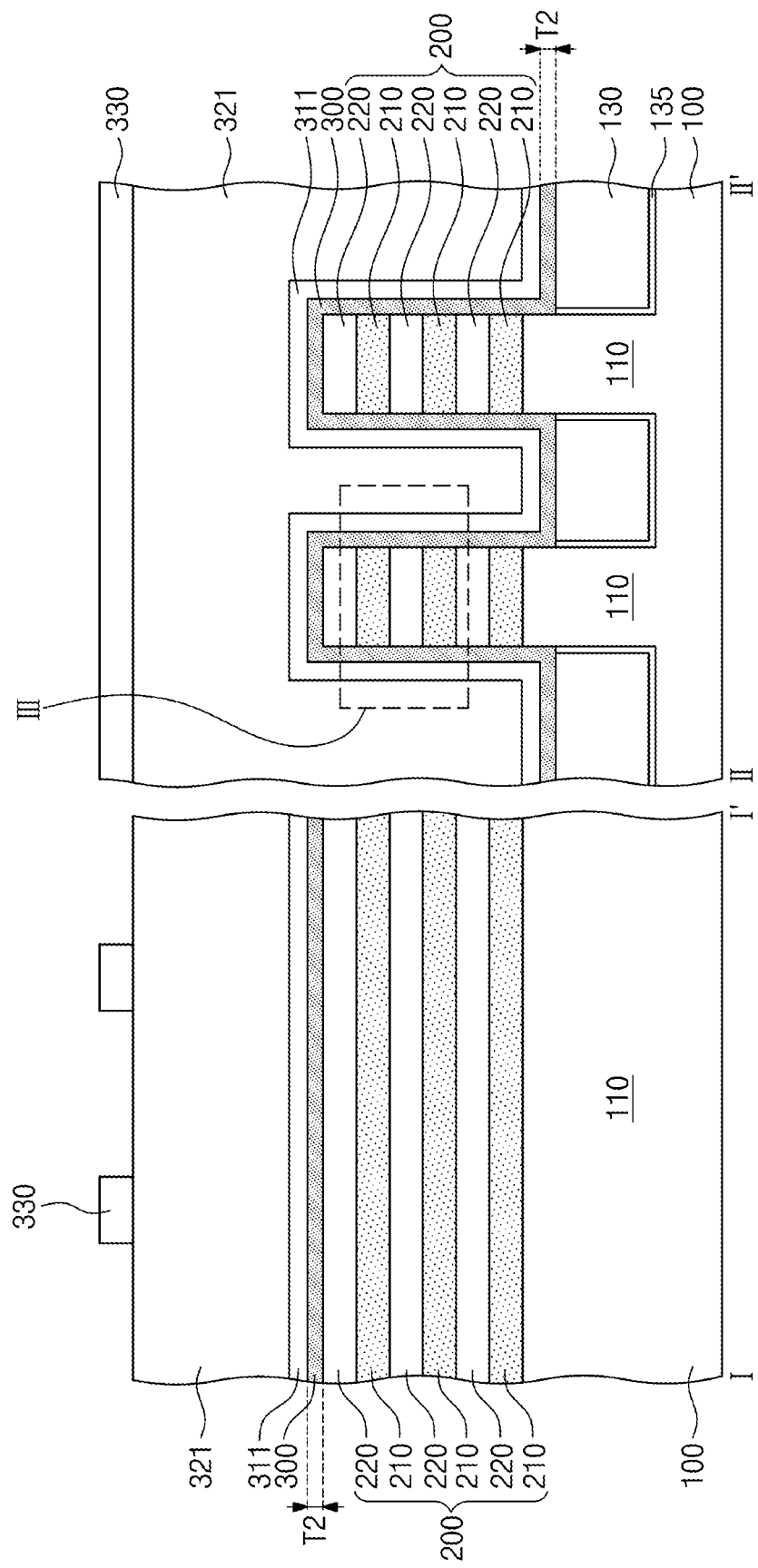
Figure 2E:
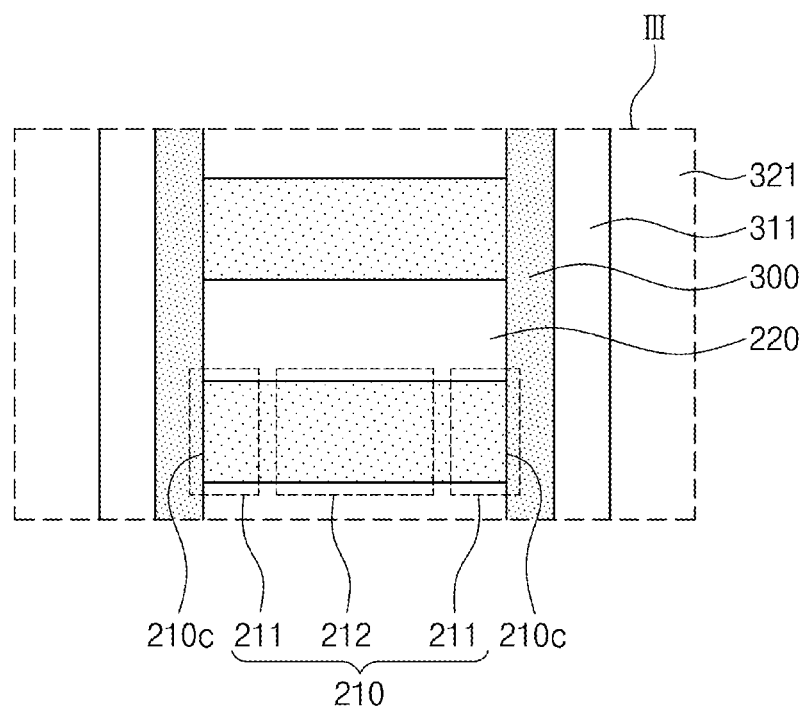

Referring to FIGS. 1, 2D and 2E, an insulating layer 311, a sacrificial gate layer 321 and a mask pattern 330 may be sequentially formed on the capping pattern 300. The insulating layer 311 may be formed by a deposition process. The insulating layer 311 may include a semiconductor oxide, for example, silicon oxide. The insulating layer 311 may have an oxygen content ratio greater than that of the capping pattern 300. The capping pattern 300 may be exposed in the process of forming the insulating layer 311, and, thus, at least a portion of the capping pattern 300 may be oxidized. As a result, after the process of forming the insulating layer 311, the capping pattern 300 may have a second thickness T2 less than the first thickness T1.

If the capping pattern 300 includes germanium, the quality of the insulating layer 311 may be deteriorated. According to some embodiments, the capping pattern 300 may not include germanium, and, thus, the quality of the insulating layer 311 may be improved.

Each of the first semiconductor patterns 210 may include first portions 211 and a second portion 212, as illustrated in FIG. 2E. The first portions 211 of each of the first semiconductor patterns 210 may be portions including sidewalls 210c of the first semiconductor pattern 210. The first portions 211 may be in physical contact with the capping pattern 300. The second portion 212 of each of the first semiconductor patterns 210 may be provided between the first portions 211. If the capping pattern 300 is omitted, the first portions 211 of the first semiconductor patterns 210 may be exposed in the process of forming the insulating layer 311 and, thus, may be oxidized. However, according to some embodiments, the capping pattern 300 may prevent the first semiconductor patterns 210 from being exposed in the process of forming the insulating layer 311. Thus, oxidation of the first portions 211 of the first semiconductor patterns 210 may be reduced or prevented. After the process of forming the insulating layer 311, the first portions 211 of the first semiconductor patterns 210 may not include oxygen. An element or component composition ratio of the first portions 211 of the first semiconductor patterns 210 may be substantially equal to an element or component composition ratio of the second portions 212 of the first semiconductor patterns 210.

If the first thickness T1 of the capping pattern 300 of FIG. 2C is less than 5 Å, it may be difficult to prevent the first and second semiconductor patterns 210 and 220 from being oxidized in the process of forming the insulating layer 311. However, according to the embodiments, the capping pattern 300 may have a first thickness T1 of 5 Å or greater.

The sacrificial gate layer 321 may be formed on the insulating layer 311 to at least partially cover the insulating layer 311. The sacrificial gate layer 321 may include, for example, poly-silicon. The mask pattern 330 may be formed on the sacrificial gate layer 321. For example, the mask pattern 330 may include silicon nitride, silicon carbonitride, and/or silicon oxycarbonitride.

Figure 2F:
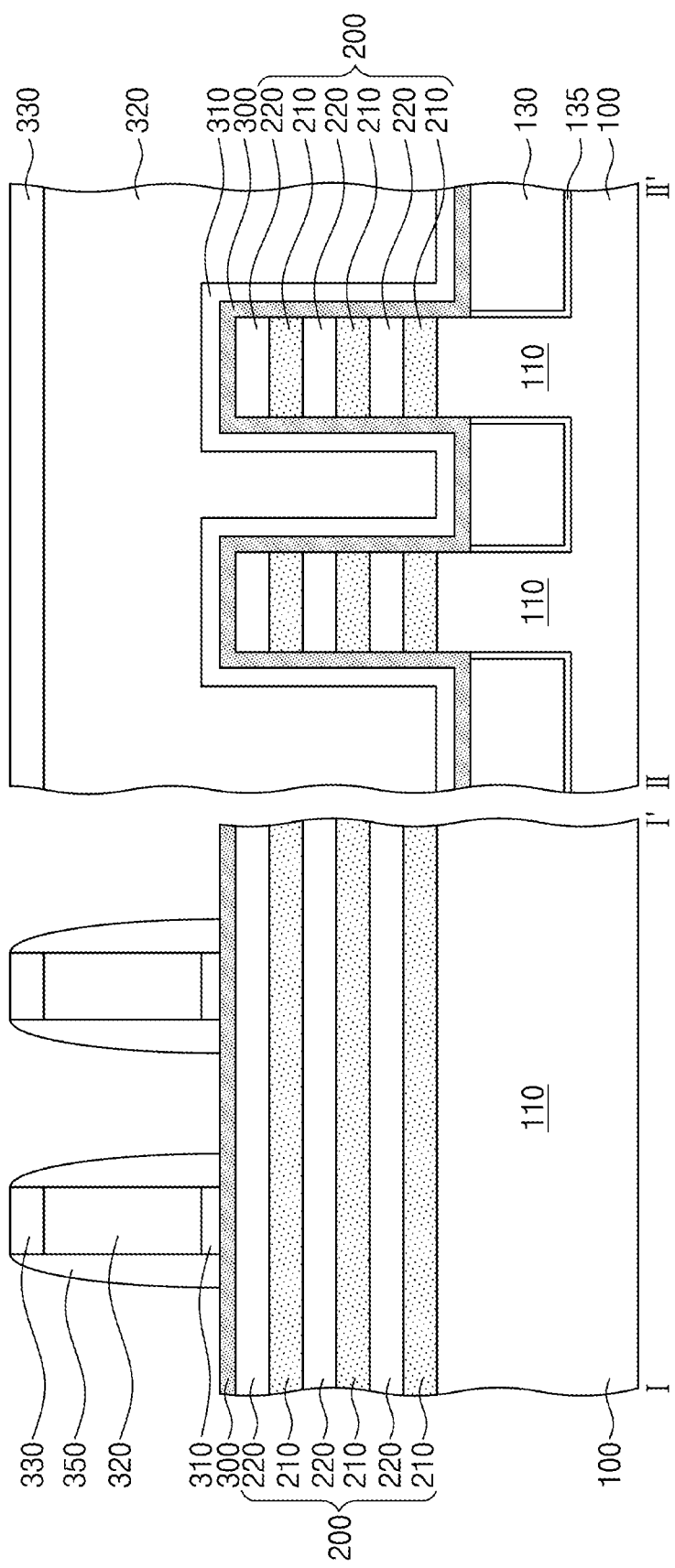

Referring to FIGS. 1 and 2F, the sacrificial gate layer 321 and the insulating layer 311 may be patterned by an etching process to form a sacrificial gate pattern 320 and an insulating pattern 310. The mask pattern 330 may be used as an etch mask in the etching process. The sacrificial gate pattern 320 and the insulating pattern 310 may extend in the second direction D2 on the substrate 100 and may intersect the active pattern 200, the base active pattern 110, and the device isolation patterns 130.

The capping pattern 300 may have an etch selectivity with respect to at least the insulating layer 311. In the etching process, an etch rate of the capping pattern 300 may be lower than an etch rate of at least the insulating layer 311. The etching process may be performed until the capping pattern 300 is exposed.

Gate spacers 350 may be formed on a top surface of the capping pattern 300 at both sides of the sacrificial gate pattern 320. The gate spacers 350 may cover sidewalls of the insulating pattern 310 and sidewalls of the sacrificial gate pattern 320. For example, the gate spacers 350 may include silicon nitride, silicon carbonitride, and/or silicon oxycarbonitride. In some embodiments, a spacer layer may be formed on the substrate 100 to at least partially cover the capping pattern 300, the insulating pattern 310, the sacrificial gate pattern 320, and the mask pattern 330. An etching process may be performed on the spacer layer to form the gate spacers 350. The etching process of the spacer layer may be an anisotropic etching process. In the etching process of the spacer layer, the capping pattern 300 may have an etch selectivity with respect to the spacer layer. For example, an etch rate of the capping pattern 300 may be lower than an etch rate of the spacer layer. After the formation of the gate spacers 350, portions of the capping pattern 300 may be provided on the active pattern 200 at both sides of the sacrificial gate pattern 320 and may be exposed by the gate spacers 350 and the mask pattern 330. Unlike FIG. 2F, in other embodiments of the inventive concept, the portions of the capping pattern 300 exposed by the gate spacers 350 and the mask pattern 330 may also be etched in the etching process of the spacer layer. In this case, the capping pattern 300 may remain locally under the gate spacers 350 and the sacrificial gate pattern 320.

Figure 2G:
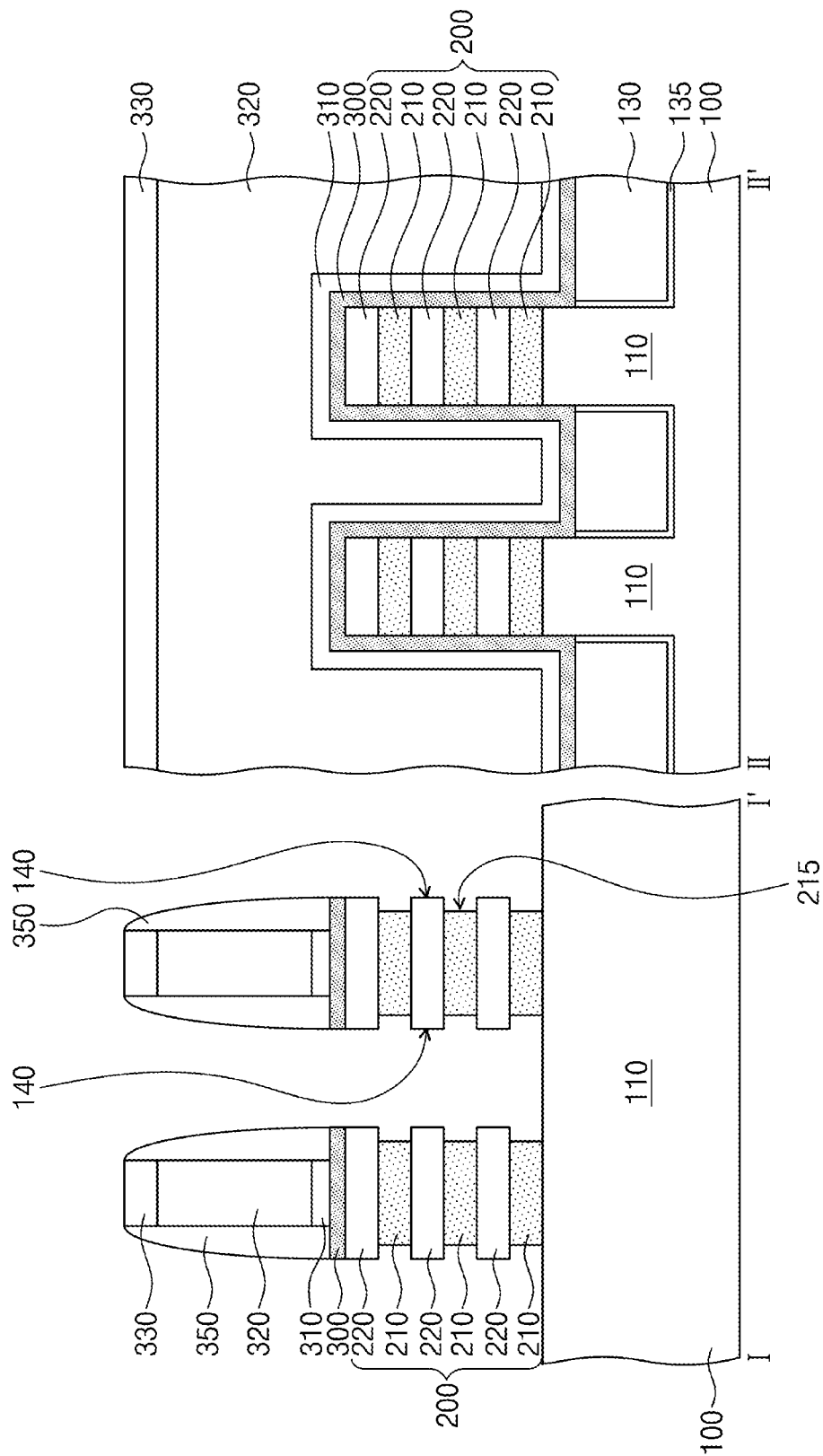

Referring to FIGS. 1 and 2G, recess portions 140 may be formed in the active pattern 200. The formation of the recess portions 140 may include etching the capping pattern 300 and portions of the active pattern 200 using the mask pattern 330 and the gate spacers 350 as etch masks. The portions of the active pattern 200 may be etched until the top surface of the base active pattern 110 is exposed. Thus, the recess portions 140 may be formed at both sides of the sacrificial gate pattern 320 and may expose the top surface of the base active pattern 110. Sidewalls of the first semiconductor patterns 210 and sidewalls of the second semiconductor patterns 220 may be exposed by the recess portions 140. Unlike FIG. 2G, in other embodiments of the inventive concept, portions of the base active pattern 110 may also be etched in the etching process of the portions of the active pattern 200, and, thus, the recess portions 140 may extend into the base active pattern 110.

Portions of the first semiconductor patterns 210 may be laterally recessed to form recess regions 215. The recess regions 215 may be formed between the second semiconductor patterns 220 and between the base active pattern 110 and the lowermost one of the second semiconductor patterns 220 as shown in FIG. 2G. The formation of the recess regions 215 may include etching the exposed sidewalls of the first semiconductor patterns 210 by using an etching source having a relatively high etch rate with respect to the first semiconductor patterns 210.

Figure 2H:
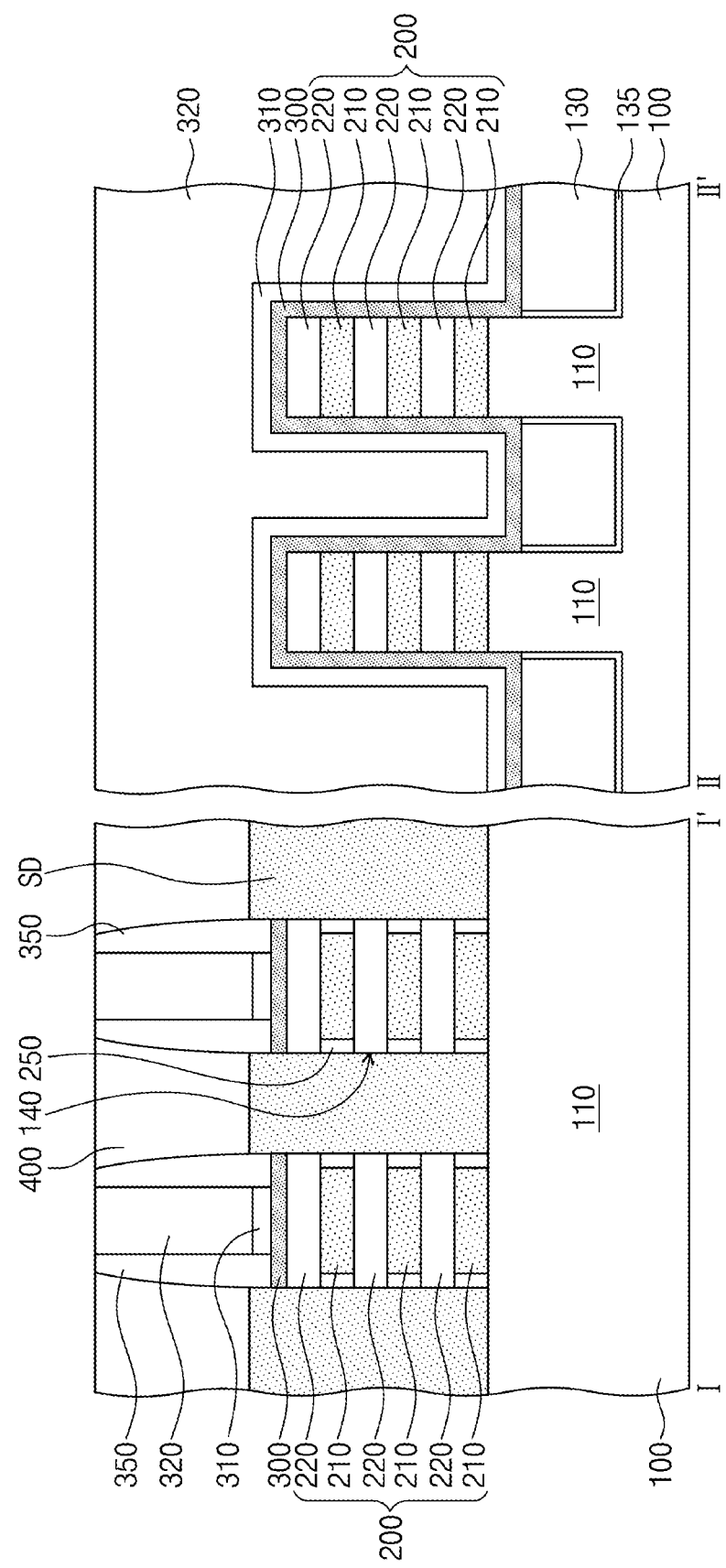

Referring to FIGS. 1 and 2H, insulating spacers 250 may be formed in the recess regions 215, respectively. The insulating spacers 250 may at least partially cover both of the recessed sidewalls of each of the first semiconductor patterns 210. The formation of the insulating spacers 250 may include conformally forming a barrier insulating layer (not shown) that at least partially fills the recess regions 215 on the first and second semiconductor patterns 210 and 220, and performing an etching process (e.g., an anisotropic etching process) on the barrier insulating layer. For example, the insulating spacers 250 may include silicon nitride and/or silicon oxycarbonitride.

Source/drain patterns SD may be formed on the base active pattern 110 at both sides of the sacrificial gate pattern 320. The source/drain patterns SD may be formed by performing a selective epitaxial growth (SEG) process using the second semiconductor patterns 220 and the base active pattern 110, exposed by the recess portions 140, as a seed layer. The source/drain patterns SD may be provided in the recess portions 140, respectively. Each of the source/drain patterns SD may be in physical contact with a sidewall of the capping pattern 300, the exposed sidewalls of the second semiconductor patterns 220, the insulating spacers 250, and the top surface of the base active pattern 110. The insulating spacers 250 may be disposed between each of the source/drain patterns SD and the first semiconductor patterns 210, respectively. The source/drain patterns SD may be spaced apart from the first semiconductor patterns 210.

The source/drain patterns SD may include silicon-germanium (SiGe), silicon (Si), and/or silicon carbide (SiC). The formation of the source/drain patterns SD may further include doping the source/drain patterns SD with a dopant. Electrical characteristics of a transistor including the source/drain patterns SD may be improved by doping of the dopant. When the transistor is an NMOSFET, the dopant may include, for example, phosphorus (P). When the transistor is a PMOSFET, the dopant may include, for example, boron (B).

An interlayer insulating layer 400 may be formed on the substrate 100 to at least partially cover the source/drain patterns SD. The formation of the interlayer insulating layer 400 may include forming a preliminary interlayer insulating layer on the source/drain patterns SD, the gate spacers 350, and the mask pattern 330 on the substrate 100, and planarizing the preliminary interlayer insulating layer until the sacrificial gate pattern 320 is exposed. The mask pattern 330 may be removed in the planarization process. For example, the interlayer insulating layer 400 may include a silicon oxide layer, a silicon nitride layer, a silicon oxynitride layer, and/or a low-k dielectric layer.

Figure 2I:
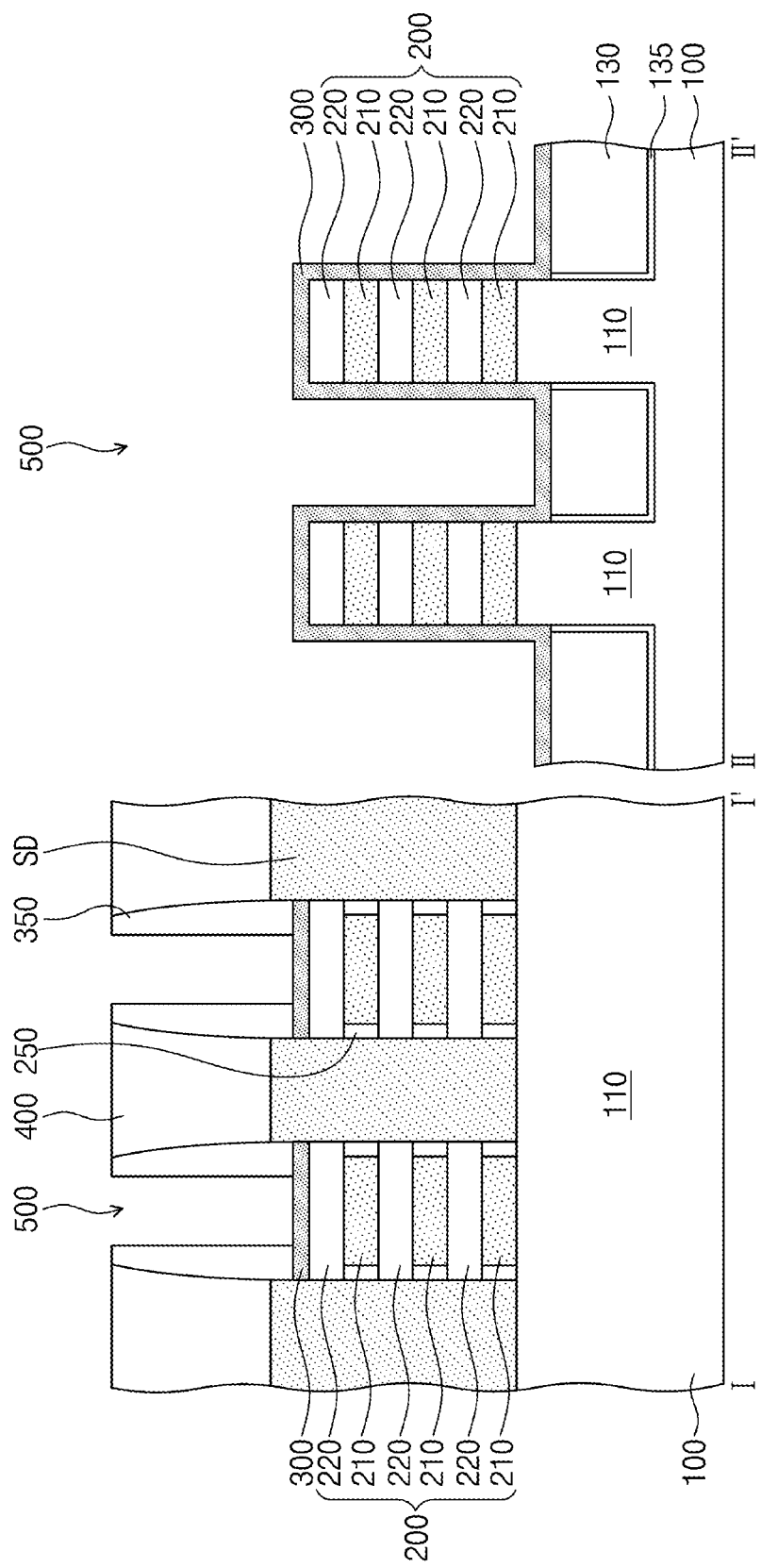

Referring to FIGS. 1 and 2I, the sacrificial gate pattern 320 and the insulating pattern 310 may be removed to form an opening 500 in the interlayer insulating layer 400. The opening 500 may expose the capping pattern 300 between the gate spacers 350. The opening 500 may have a linear shape extending in the second direction D2 when viewed in a plan view. The formation of the opening 500 may include etching the sacrificial gate pattern 320 by performing an etching process having an etch selectivity with respect to the gate spacers 350, the interlayer insulating layer 400, and the capping pattern 300. The insulating pattern 310 may also be removed in the etching process. In other embodiments, the removal of the insulating pattern 310 may be performed by a different etching process from the etching process of the sacrificial gate pattern 320.

Figure 2J:
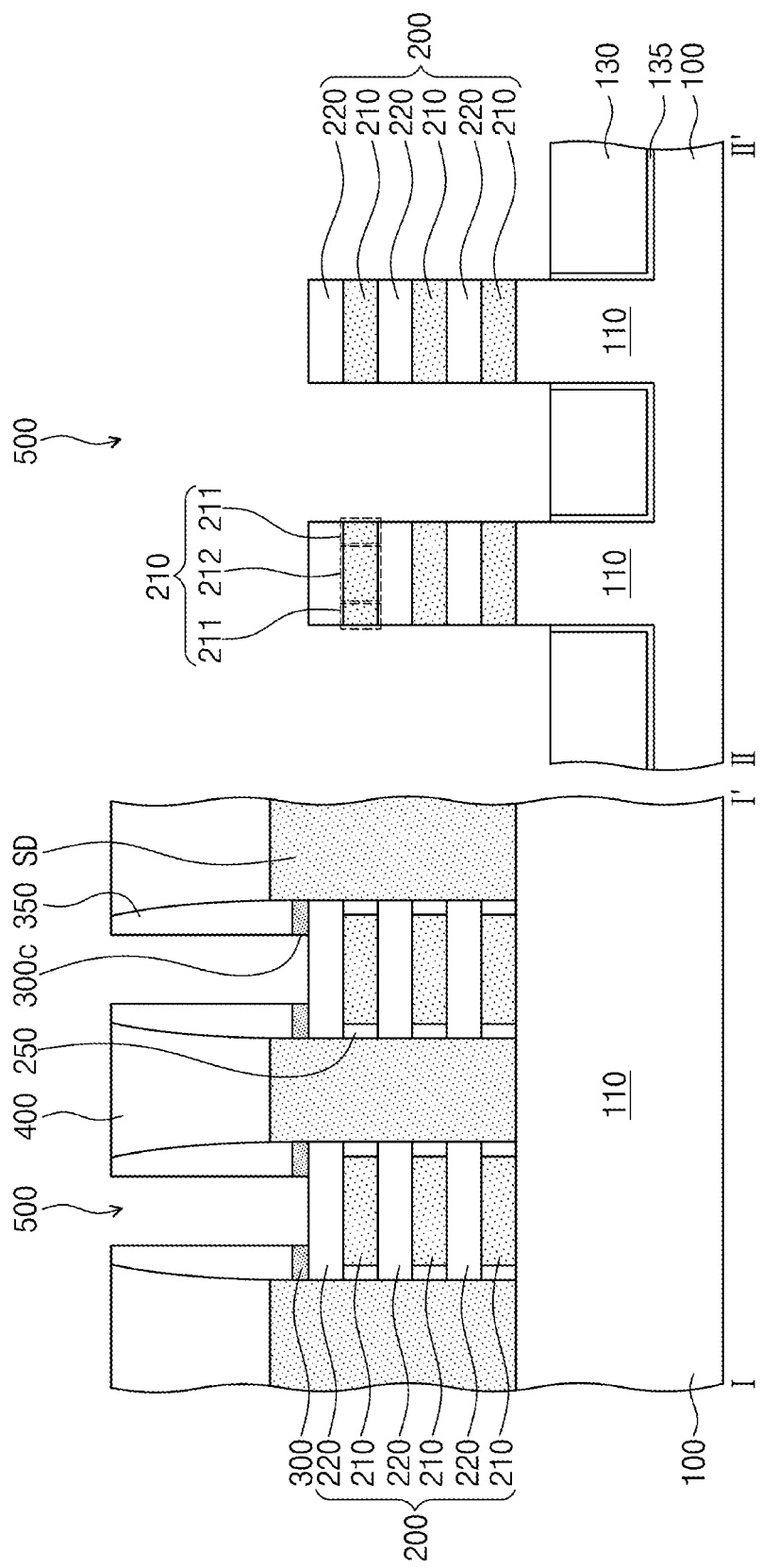

Referring to FIGS. 1 and 2J, a portion of the capping pattern 300 exposed by the opening 500 may be removed by an etching process. Thus, the opening 500 may expose the active pattern 200 and the device isolation patterns 130 between the gate spacers 350. For example, as shown in FIG. 2J, the opening 500 may expose the top surface of the uppermost one of the second semiconductor patterns 220, the sidewalls of the second semiconductor patterns 220, and the sidewalls of the first semiconductor patterns 210.

The etching process of the capping pattern 300 may be different from the etching process of the insulating pattern 310 of FIG. 2I according to some embodiments of the inventive concept. The etching process of the capping pattern 300 may be performed by an anisotropic etching process. In the etching process of the capping pattern 300, the gate spacers 350 may have an etch selectivity with respect to the capping pattern 300. If the capping pattern 300 includes nitrogen, it may be difficult to selectively remove the capping pattern 300. However, according to some embodiments, the capping pattern 300 may not include nitrogen, and, thus, the etching process of the capping pattern 300 may be more easily performed.

Other portions of the capping pattern 300 may not be exposed in the etching process. The other portions of the capping pattern 300 may be disposed under the gate spacers 350. Thus, after the etching process, the capping pattern 300 may remain between the active pattern 200 and the gate spacers 350. The opening 500 may expose a sidewall 300c of the capping pattern 300.

Figure 2K:
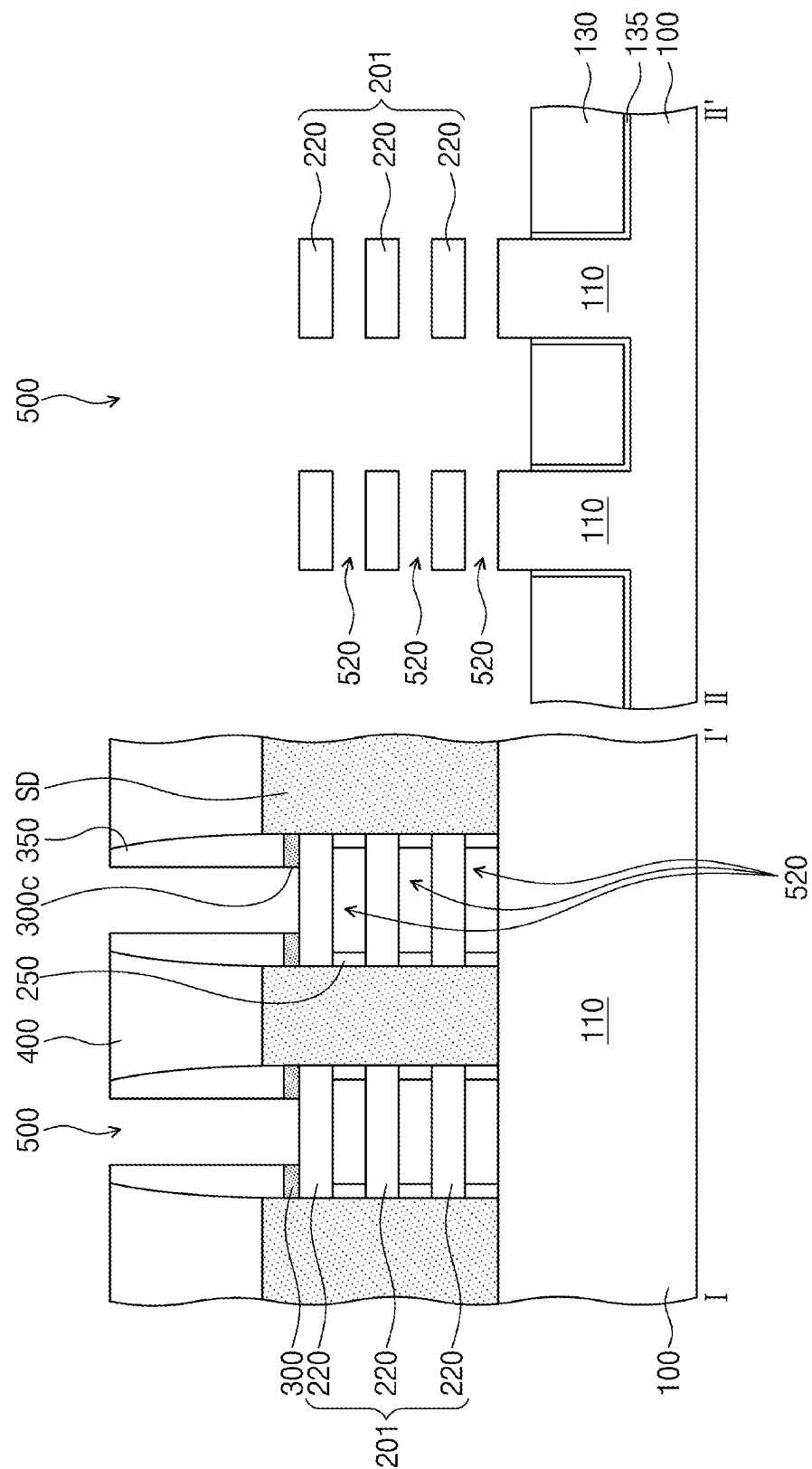

Referring to FIGS. 1 and 2K, the first semiconductor patterns 210 exposed by the opening 500 may be removed by an etching process to form opening regions 520. In the etching process, the first semiconductor patterns 210 may have an etch selectivity with respect to the second semiconductor patterns 220. For example, in the etching process, an etch rate of the first semiconductor patterns 210 may be greater than an etch rate of the second semiconductor patterns 220. When the first semiconductor patterns 210 include silicon-germanium (SiGe) and the second semiconductor patterns 220 include silicon (Si), the etching process of the first semiconductor patterns 210 may be performed by a wet etching process using an etching solution including peracetic acid.

As described above with reference to FIGS. 2D and 2E, if the first semiconductor pattern 210 is exposed in the process of forming the insulating layer 311, the first portions 211 of the first semiconductor pattern 210 may be oxidized. It may be difficult to etch the oxidized first portions 211 of the first semiconductor pattern 210 in the etching process of the first semiconductor pattern 210. In other words, a difference between an etch rate of the first portions 211 of the first semiconductor patterns 210 and the etch rate of the second semiconductor patterns 220 may be reduced. However, according to some embodiments, the capping pattern 300 may be formed, and, thus, the first semiconductor patterns 210 may not be exposed in the process of forming the insulating layer 311. As a result, the first portions 211 of the first semiconductor patterns 210 may not be oxidized in some embodiments. The etch rate of the first portions 211 of the first semiconductor patterns 210 may be much higher than the etch rate of the second semiconductor patterns 220.

Therefore, the opening regions 520 may be more easily formed in the etching process. Here, the opening regions 520 may be empty regions.

The opening regions 520 may be formed between the second semiconductor patterns 220 and between the base active pattern 110 and the lowermost one of the second semiconductor patterns 220 as shown in FIG. 2K. As described above, the opening regions 520 may be empty regions. The opening regions 520 may be connected to the opening 500. During the etching process, the source/drain patterns SD may be protected by the interlayer insulating layer 400 and the gate spacers 350.

After formation of the opening regions 520, an active pattern 201 may include the second semiconductor patterns 220 spaced apart from each other. The second semiconductor patterns 220 may be spaced apart from each other in the direction perpendicular to the bottom surface of the substrate 100.

Figure 2L:
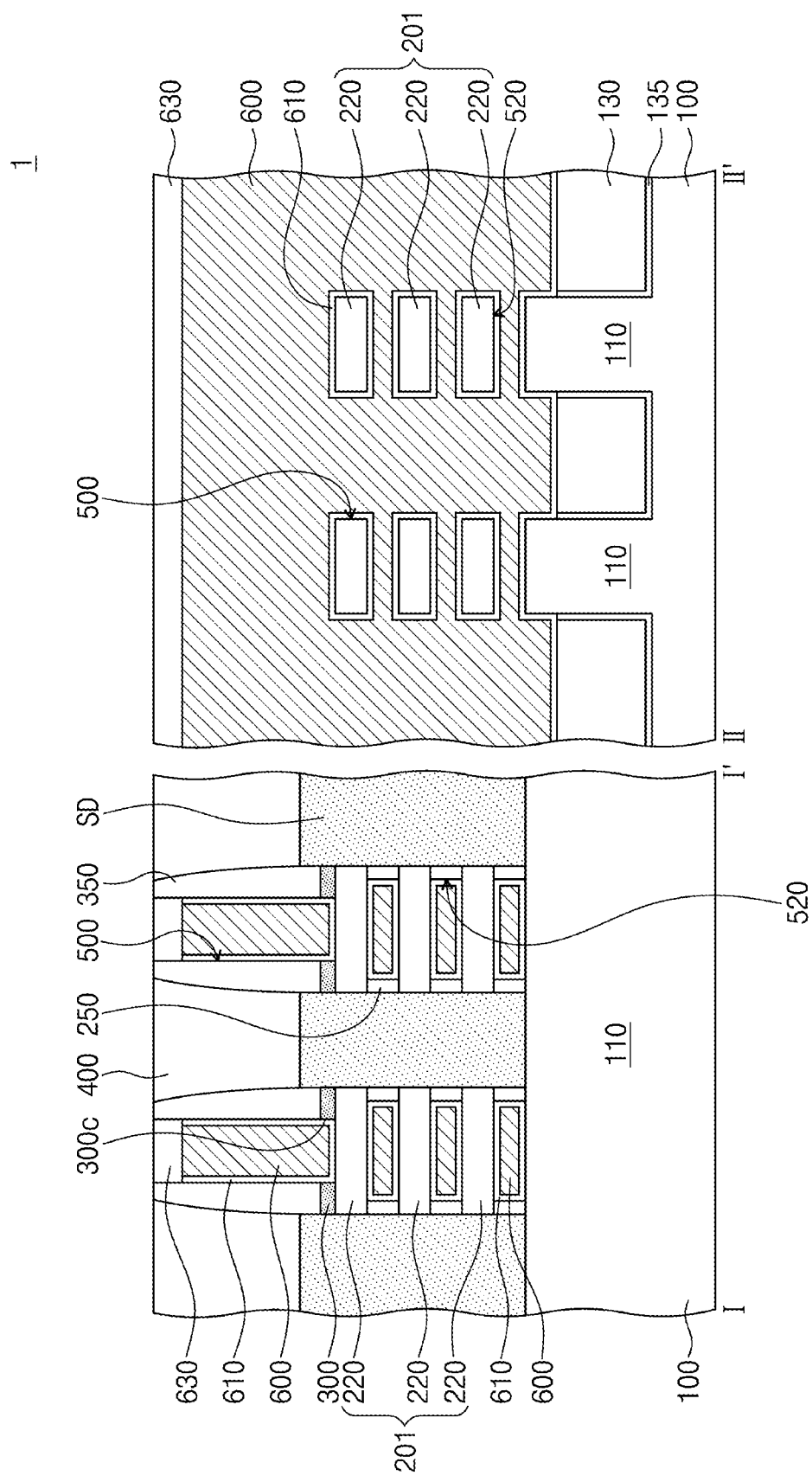

Referring to FIGS. 1 and 2L, a gate insulating pattern 610 and a gate pattern 600 may be formed in the opening 500 and the opening regions 520. The formation of the gate insulating pattern 610 and the gate pattern 600 may include forming a gate insulating layer conformally covering inner surfaces of the opening 500 and the opening regions 520, forming a gate conductive layer at least partially filling remaining regions of the opening 500 and the opening regions 520, and performing a planarization process on the gate insulating layer and the gate conductive layer until the interlayer insulating layer 400 is exposed, thereby locally forming the gate insulating pattern 610 and the gate pattern 600 in the opening 500 and the opening regions 520.

The gate insulating pattern 610 may at least partially cover the base active pattern 110, the device isolation patterns 130, and the second semiconductor patterns 220. The gate insulating pattern 610 may be provided on the sidewall 300c of the capping pattern 300 and a top surface of the active pattern 201. For example, the gate insulating pattern 610 may include a silicon oxide layer, a silicon nitride layer, a silicon oxynitride layer, and/or a high-k dielectric layer. The high-k dielectric layer may include a material of which a dielectric constant is greater than that of a silicon oxide layer. For example, the high-k dielectric layer may include a hafnium oxide (HfO) layer, an aluminum oxide (AlO) layer, and/or a tantalum oxide (TaO) layer. For example, the gate pattern 600 may include a doped semiconductor material, a conductive metal nitride, and/or a metal. The gate pattern 600 may at least partially fill the opening 500 and the opening regions 520. The gate pattern 600 may at least partially cover the gate insulating pattern 610 and may be spaced apart from the second semiconductor patterns 220 and the base active pattern 110. The gate pattern 600 may be spaced apart from the source/drain patterns SD with the gate spacers 350 interposed therebetween.

The second semiconductor patterns 220 may function as a channel of a transistor. The second semiconductor patterns 220 may function as a bridge channel or nanowire channel connecting the source/drain patterns SD. Each of the source/drain patterns SD may be in physical contact with the second semiconductor patterns 220. The source/drain patterns SD may be spaced apart from each other in the first direction D1 with the second semiconductor patterns 220 interposed therebetween. The second semiconductor patterns 220 and the source/drain patterns SD may constitute an active structure AS provided on the base active pattern 110. The active structure AS and the gate pattern 600 may constitute a gate-all-around type field effect transistor.

A gate capping pattern 630 may be formed on the gate pattern 600. In some embodiments, upper portions of the gate insulating pattern 610 and the gate pattern 600 may be recessed to form a groove between the gate spacers 350. The gate capping pattern 630 may be formed in the groove. For example, the gate capping pattern 630 may include a silicon oxide layer, a silicon nitride layer, and/or a silicon oxynitride layer.

An upper insulating layer (not shown) may be formed on the interlayer insulating layer 400. First contact plugs (not shown) may be formed to penetrate the upper insulating layer and the interlayer insulating layer 400 and may be electrically connected to the source/drain patterns SD. A second contact plug (not shown) may be formed to penetrate the upper insulating layer and the gate capping pattern 630 and may be electrically connected to the gate pattern 600. Interconnection lines (not shown) may be formed on the upper insulating layer so as to be connected to the first and second contact plugs. The first and second contact plugs and the interconnection lines may be formed of a conductive material. The manufacture of a semiconductor device 1 may be completed by the aforementioned embodiments. The semiconductor device 1 may include the transistor.

Figure 3A:
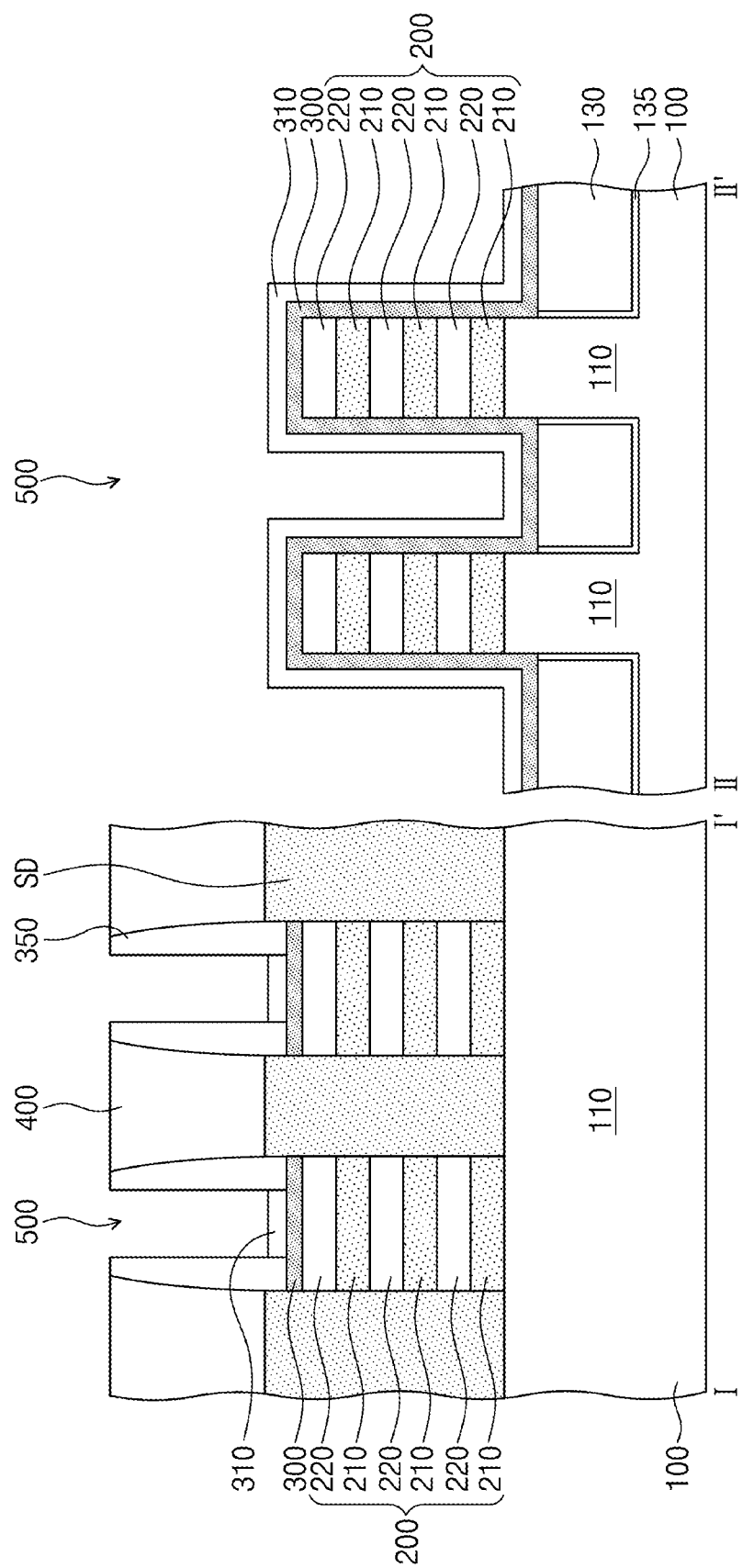
FIGS. 3A and 3B are views illustrating a method of manufacturing a semiconductor device, according to some embodiments of the inventive concept.
Figure 3B:
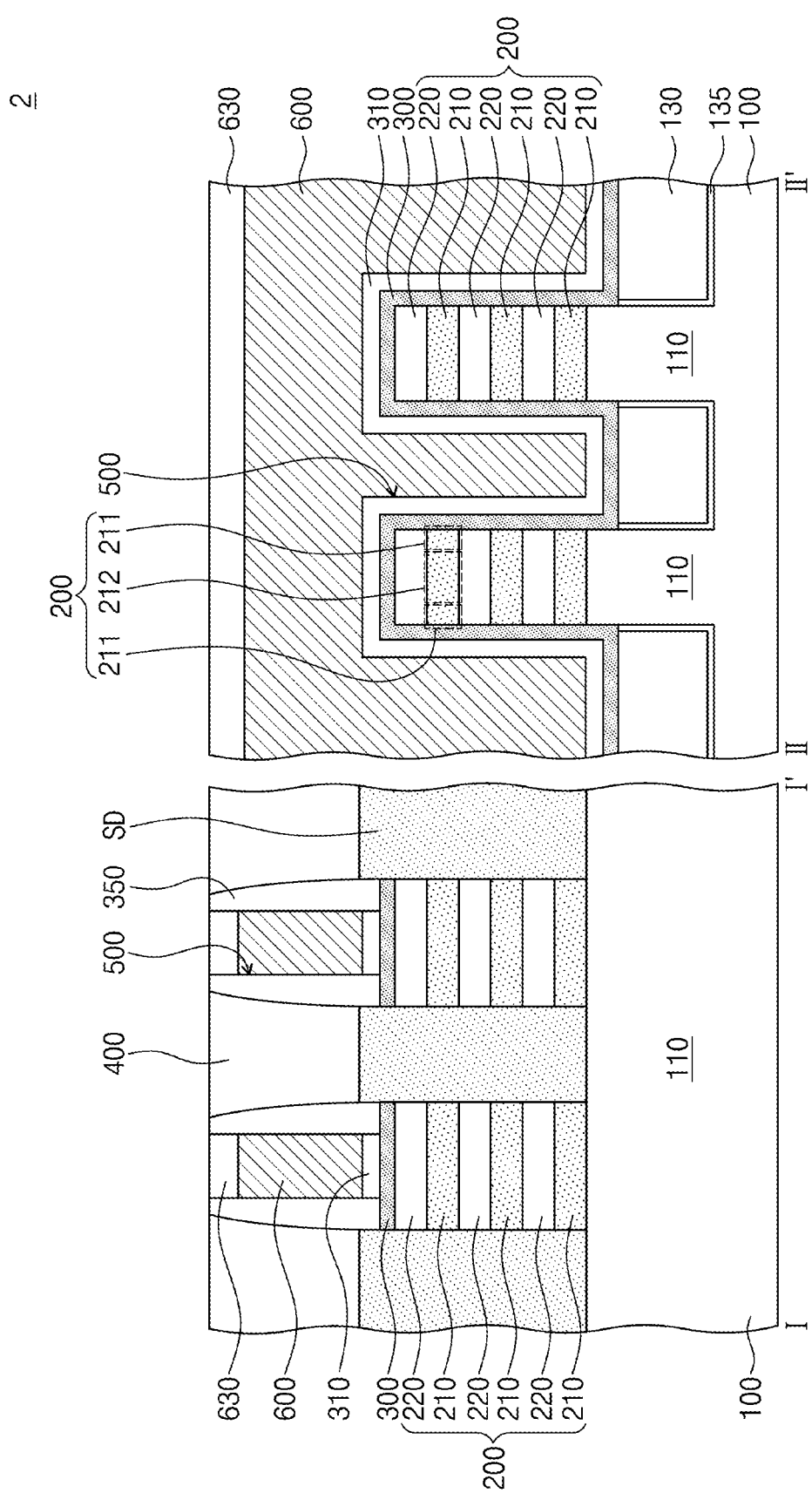

FIGS. 3A and 3B are cross-sectional views corresponding to the lines I-I' and II-II' of FIG. 1 to illustrate a method of manufacturing a semiconductor device, according to some embodiments of the inventive concepts. Hereinafter, the descriptions of the same components and/or features as in the above embodiments will be omitted or mentioned briefly for convenience in explanation.

Referring again to FIGS. 1 and 2H, the base active pattern 110, the device isolation patterns 130, the active pattern 200, the capping pattern 300, the insulating pattern 310, the sacrificial gate pattern 320, the gate spacers 350, the source/drain patterns SD and the interlayer insulating layer 400 may be formed on the substrate 100 as described with reference to FIGS. 2A to 2H. However, the recess regions 215 and the insulating spacers 250 described in FIG. 2G may not be formed.

Referring to FIGS. 1 and 3A, the sacrificial gate pattern 320 may be removed to form an opening 500 in the interlayer insulating layer 400. Here, the opening 500 may expose the insulating pattern 310 between the gate spacers 350. The formation of the opening 500 may include etching the sacrificial gate pattern 320 by performing an etching process having an etch selectivity with respect to the gate spacers 350, the interlayer insulating layer 400, and the insulating pattern 310.

Referring to FIGS. 1 and 3B, a gate pattern 600 may be formed in the opening 500. The formation of the gate pattern 600 may include forming a gate conductive layer filling the opening 500, and performing a planarization process on the gate conductive layer until the interlayer insulating layer 400 is exposed, thereby locally forming the gate pattern 600 in the opening 500. A material and planar arrangement of the gate pattern 600 may be the same as described with reference to FIG. 2L. The gate pattern 600 may be provided on the insulating pattern 310 and may be spaced apart from the first and second semiconductor patterns 210 and 220 and the base active pattern 110. The insulating pattern 310 may be provided under the gate pattern 600 and may function as a gate insulating layer.

Each of the source/drain patterns SD may be in physical contact with the first and second semiconductor patterns 210 and 220. The source/drain patterns SD may be spaced apart from each other in the first direction D1 with the first and second semiconductor patterns 210 and 220 interposed therebetween. The first semiconductor patterns 210 and the second semiconductor patterns 220 may function as a channel of a transistor.

If the capping pattern 300 is omitted, the first portions 211 of the first semiconductor patterns 210 may be oxidized as described with reference to FIGS. 2D and 2E. In this case, interface characteristics between the insulating pattern 310 and the first portions 211 of the first semiconductor patterns 210 may be deteriorated. Thus, operating reliability of the transistor may be deteriorated. However, according to some embodiments, the capping pattern 300 may be formed, and, thus, the first portions 211 of the first semiconductor patterns 210 may not include oxygen but may have substantially the same composition ratio, i.e., composition ratio of elements and/or components, as the second portion 212. Thus, interface characteristics between the capping pattern 300 and the first semiconductor patterns 210 may be improved. For example, electron traps may not be generated between the capping pattern 300 and the first portions 211 of the first semiconductor patterns 210. As a result, operating reliability of the transistor manufactured according to some embodiments of the inventive concept may be improved.

The capping pattern 300 may be disposed between the insulating pattern 310 and the first semiconductor patterns 210 and between the insulating pattern 310 and the second semiconductor patterns 220. The capping pattern 300 may also be disposed between the insulating pattern 310 and the device isolation patterns 130. If the capping pattern 300 includes nitrogen, operating characteristics of the transistor may be deteriorated. However, according to some embodiments, the capping pattern 300 may not include nitrogen, and, thus, the transistor may have improved operating characteristics.

A gate capping pattern 630 may be formed on the gate pattern 600. A semiconductor device 2 may be manufactured by the aforementioned embodiments. The semiconductor device 2 may include the transistor.

FIGS. 4A to 4E are cross-sectional views corresponding to the lines I-I' and II-II' of FIG. 1 to illustrate a method of manufacturing a semiconductor device, according to some embodiments of the inventive concepts. Hereinafter, the descriptions to the same components and/or features as in the above embodiments will be omitted or mentioned briefly for convenience in explanation. Embodiments of FIGS. 4A to 4E will also refer to FIG. 1.

Figure 4A:
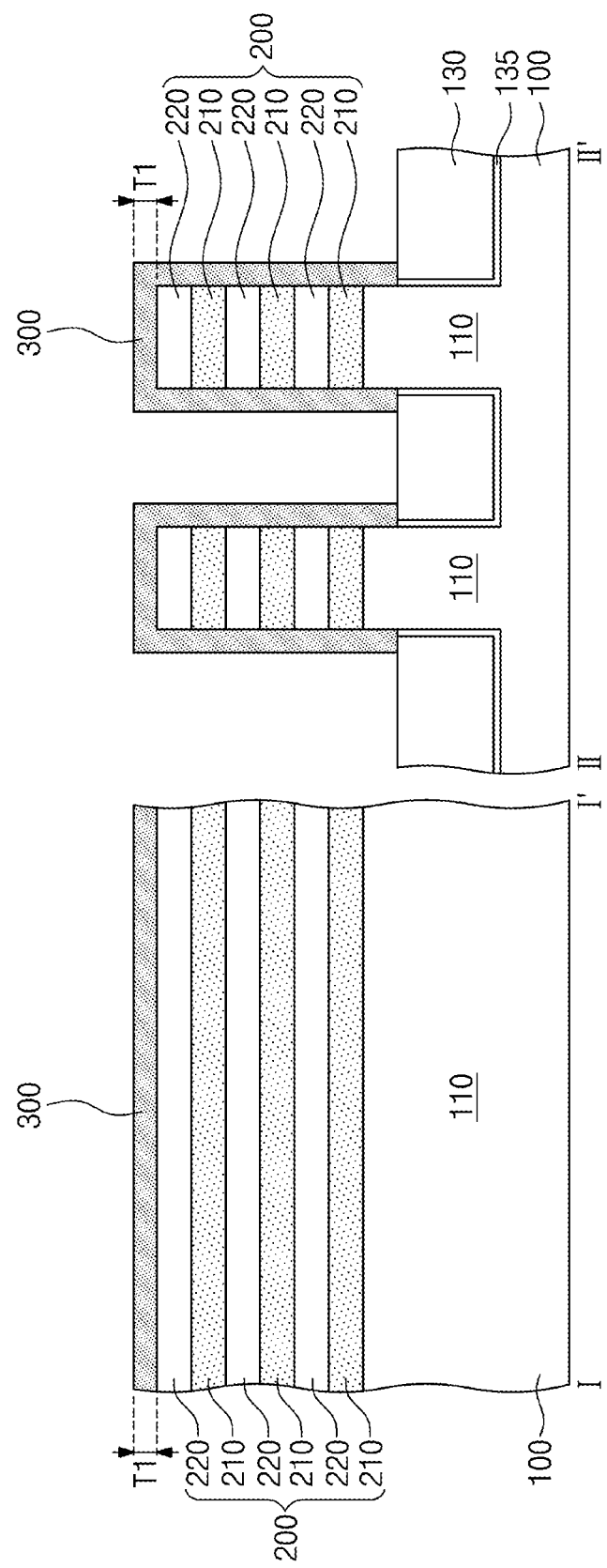
FIGS. 4A to 4E are views illustrating a method of manufacturing a semiconductor device, according to some embodiments of the inventive concept.

Referring to FIG. 4A, an active pattern 200 and device isolation patterns 130 may be formed on the substrate 100. The active pattern 200 and the device isolation patterns 130 may be formed by the methods described with reference to FIGS. 2A and 2B. A capping pattern 300 may be formed on a top surface and a sidewall of the active pattern 200.

However, the capping pattern 300 may not be formed on top surfaces of the device isolation patterns 130. The formation of the capping pattern 300 may be performed by a selective epitaxial growth (SEG) process. The selective epitaxial growth (SEG) process may be performed using a silicon-containing gas as a source gas at a temperature of about 300 degrees Celsius to about 950 degrees Celsius. The silicon-containing gas may be the same as that described with reference to FIG. 2C. A hydrogen chloride gas may also be used in the selective epitaxial growth (SEG) process. The capping pattern 300 may have a first thickness T1, and the first thickness T1 may range from about 5 Å to about 500 Å.

Before the formation of the capping pattern 300, a cleaning process may be performed on the active pattern 200.

Figure 4B:
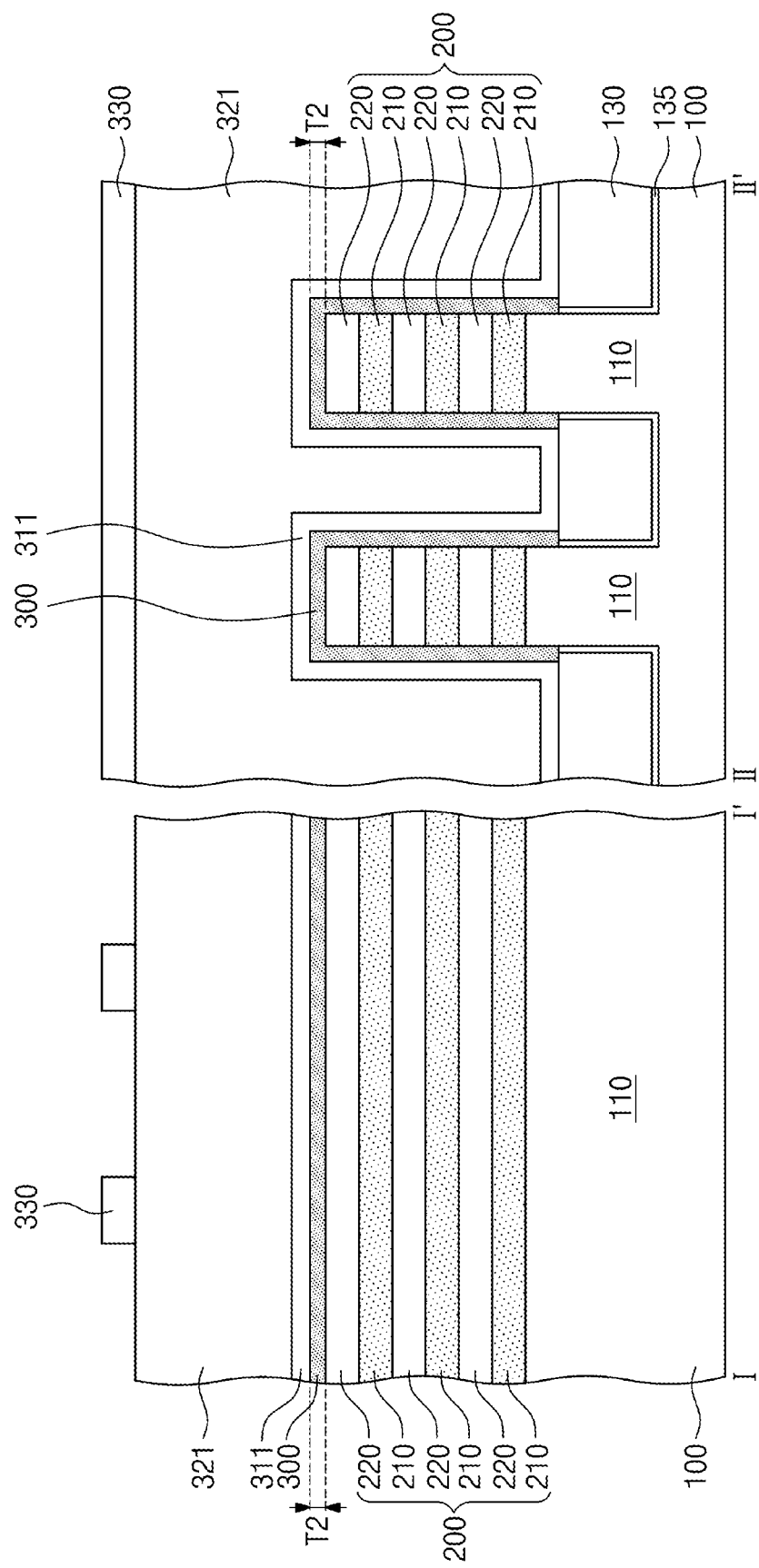

Referring to FIG. 4B, an insulating layer 311 may be formed on the capping pattern 300 and the top surfaces of the device isolation patterns 130. During the process of forming the insulating layer 311, at least a portion of the capping pattern 300 may be oxidized. After the process of forming the insulating layer 311, the capping pattern 300 may have a second thickness T2 less than the first thickness T1. A sacrificial gate layer 321 and a mask pattern 330 may be formed on the insulating layer 311. A method of forming the insulating layer 311, the sacrificial gate layer 321 and the mask pattern 330 may be the same as described above.

Figure 4C:
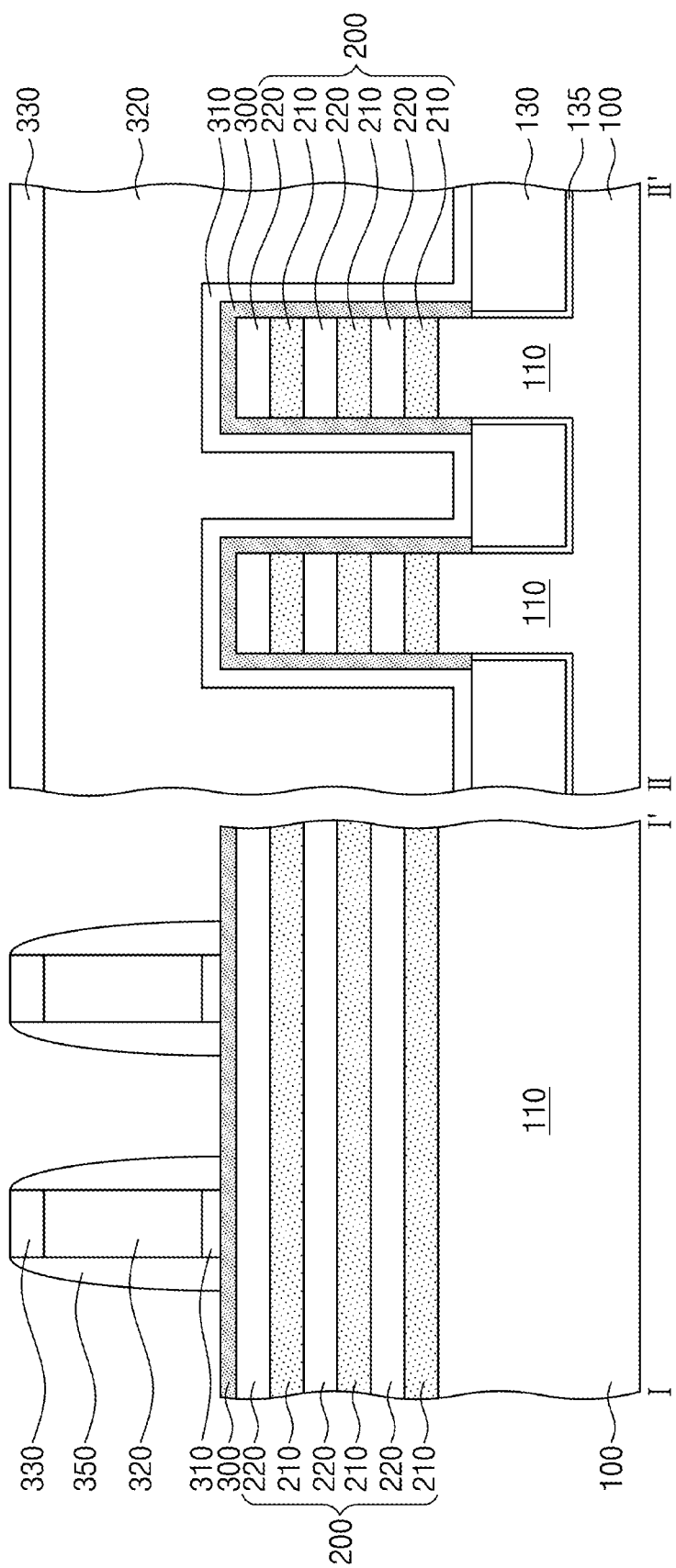

Referring to FIG. 4C, the sacrificial gate layer 321 and the insulating layer 311 may be patterned to form a sacrificial gate pattern 320 and an insulating pattern 310. The sacrificial gate pattern 320 and the insulating pattern 310 may be formed by an etching process using the mask pattern 330 as an etch mask. Thereafter, gate spacers 350 may be formed on the capping pattern 300 at both sides of the sacrificial gate pattern 320.

Figure 4D:
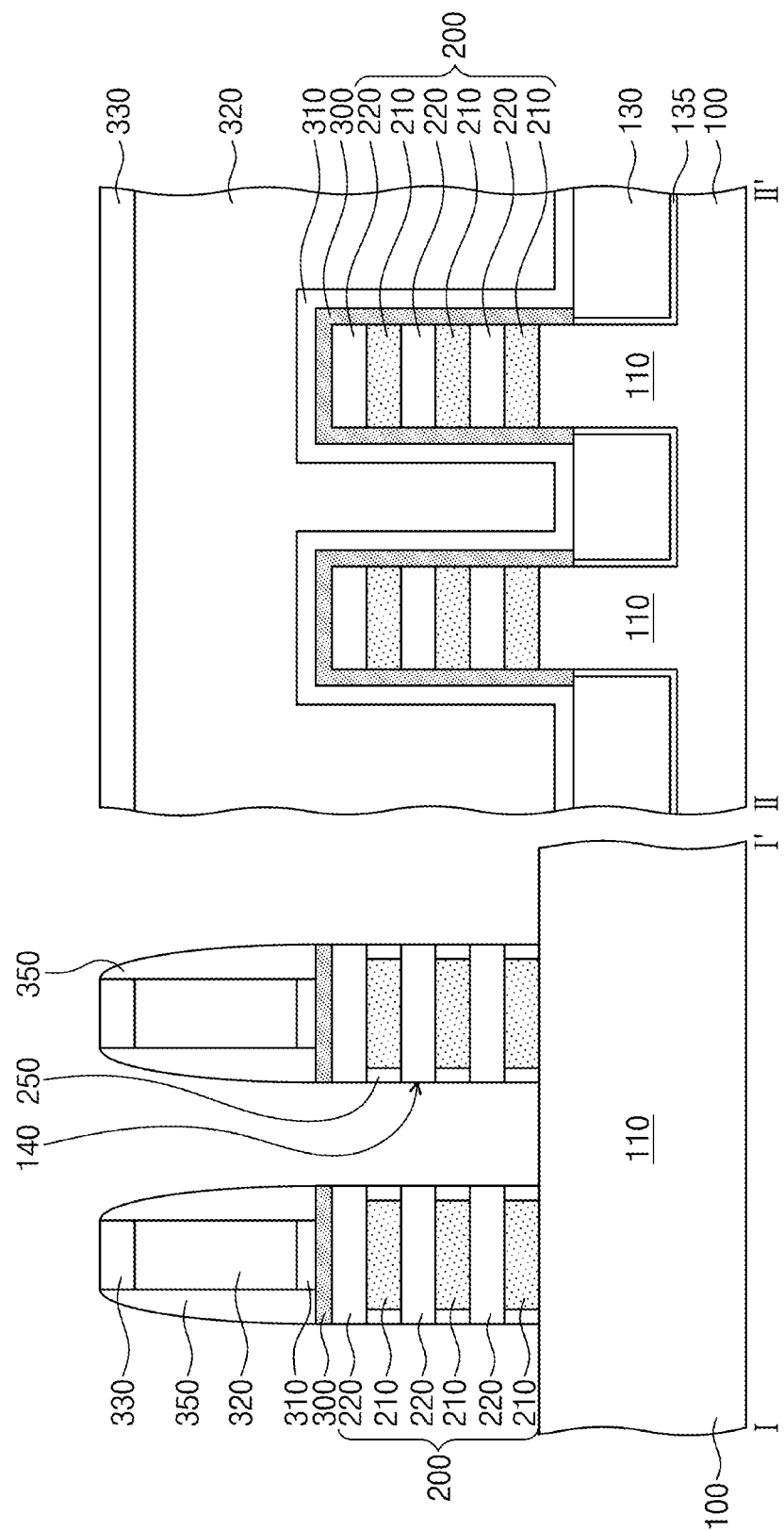

Referring to FIG. 4D, the capping pattern 300 and the active pattern 200 may be etched using the mask pattern 330 and the gate spacers 350 as etch masks. Thus, recess portions 140 may be formed in the active pattern 200. Portions of the first semiconductor patterns 210 may be laterally removed, and, thus, sidewalls of the first semiconductor patterns 210 may be laterally recessed. Insulating spacers 250 may be formed on the recessed sidewalls of the first semiconductor patterns 210 and under the second semiconductor patterns 220.

Figure 4E:
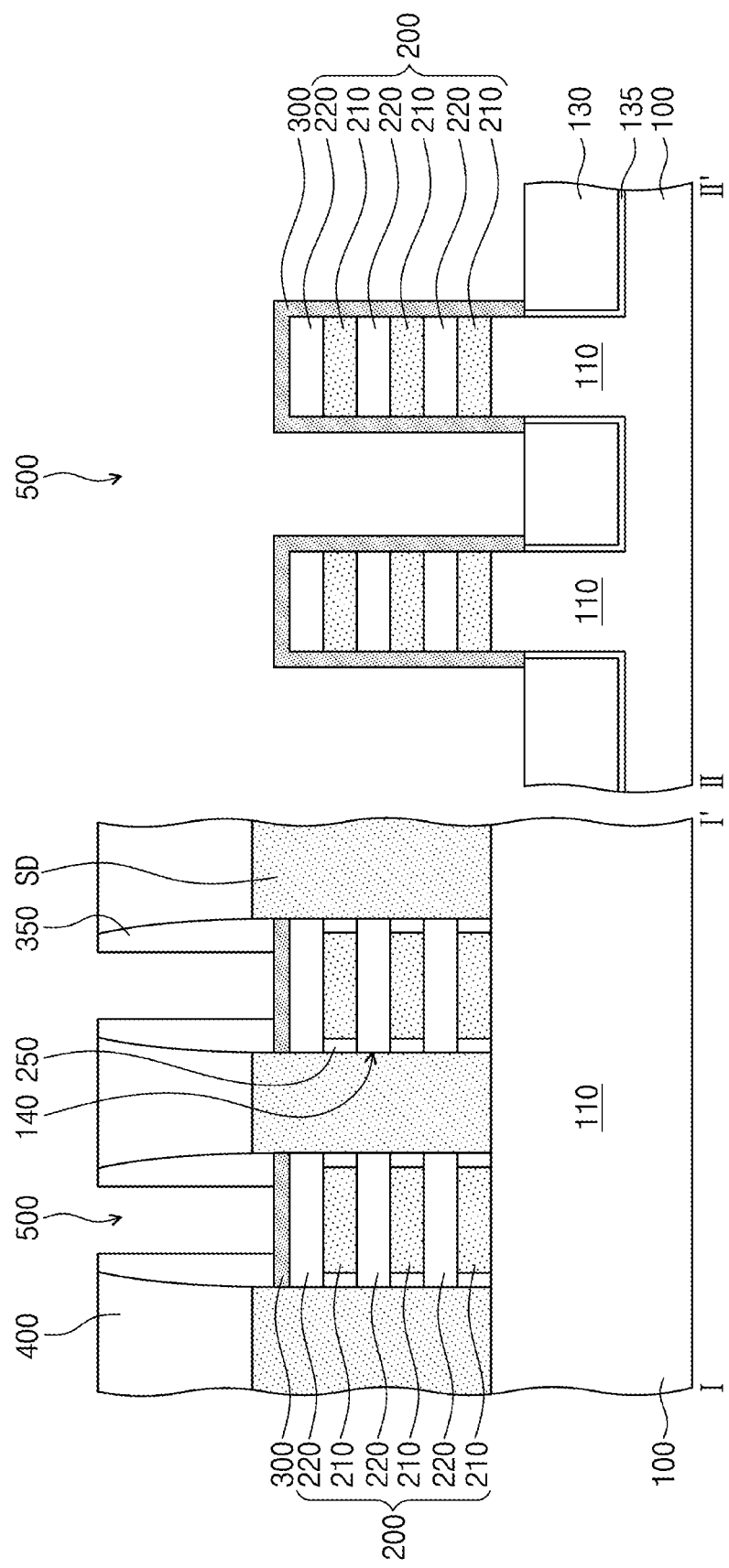

Referring to FIG. 4E, source/drain patterns SD may be formed in the recess portions 140. An interlayer insulating layer 400 may be formed to at least partially cover the source/drain patterns SD. The mask pattern 330 may be removed in the process of forming the interlayer insulating layer 400. An opening 500 exposing the capping pattern 300 may be formed by removing the sacrificial gate pattern 320 and the insulating pattern 310.

Referring again to FIG. 2J, the exposed capping pattern 300 may be removed, and, thus, the opening 500 may expose the active pattern 200 and the device isolation patterns 130. Thereafter, as illustrated in FIG. 2K, the first semiconductor patterns 210 exposed by the opening 500 may be removed by an etching process to form opening regions 520. After formation of the opening regions 520, an active pattern 201 may include the second semiconductor patterns 220 spaced apart from each other.

Referring to FIG. 2L, the gate insulating pattern 610 and the gate pattern 600 may be formed in the opening 500 and the opening regions 520. Thus, the manufacture of the semiconductor device 1 may be completed.

Figure 4F:
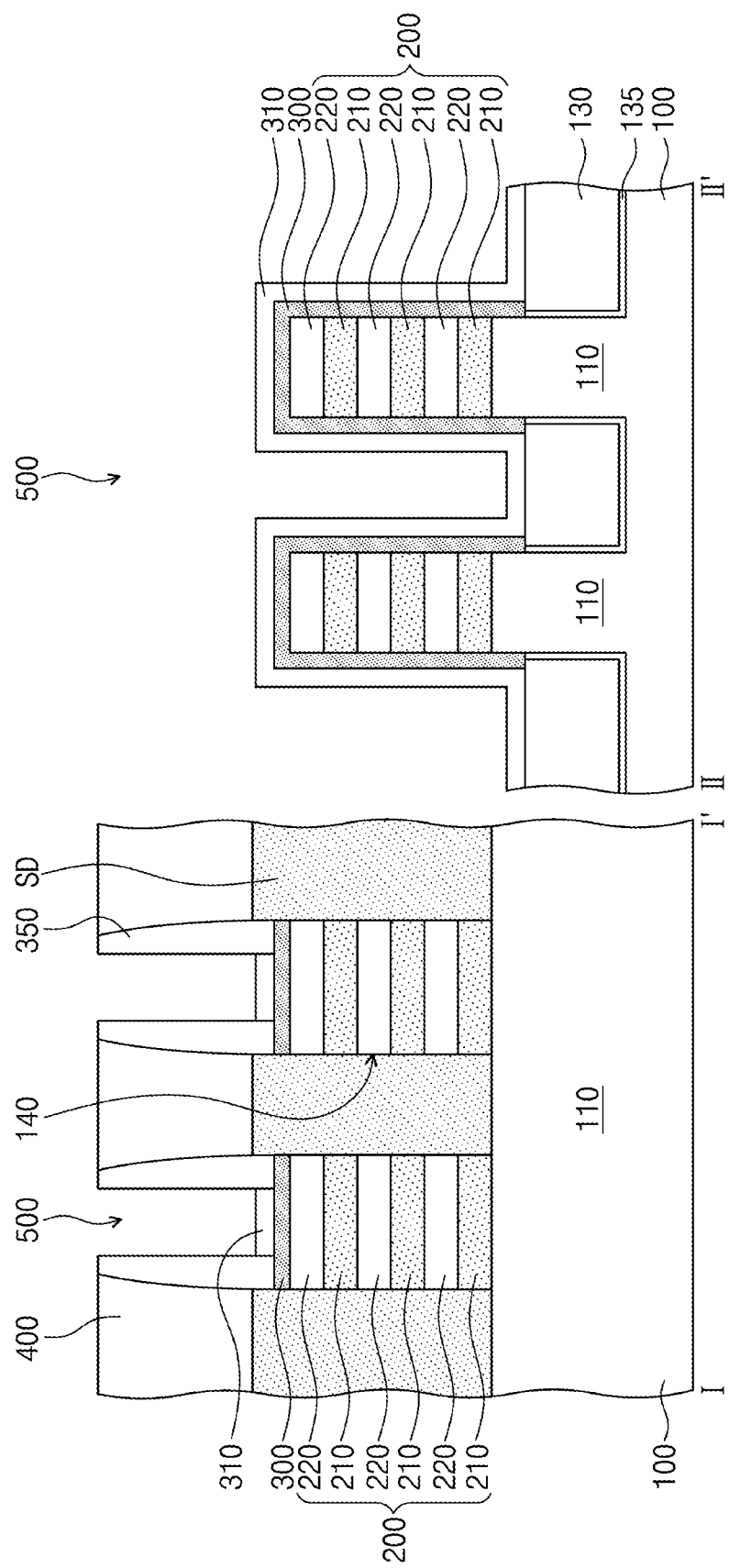
FIGS. 4F and 4G are views illustrating a method of manufacturing a semiconductor device, according to some embodiments of the inventive concept.
Figure 4G:
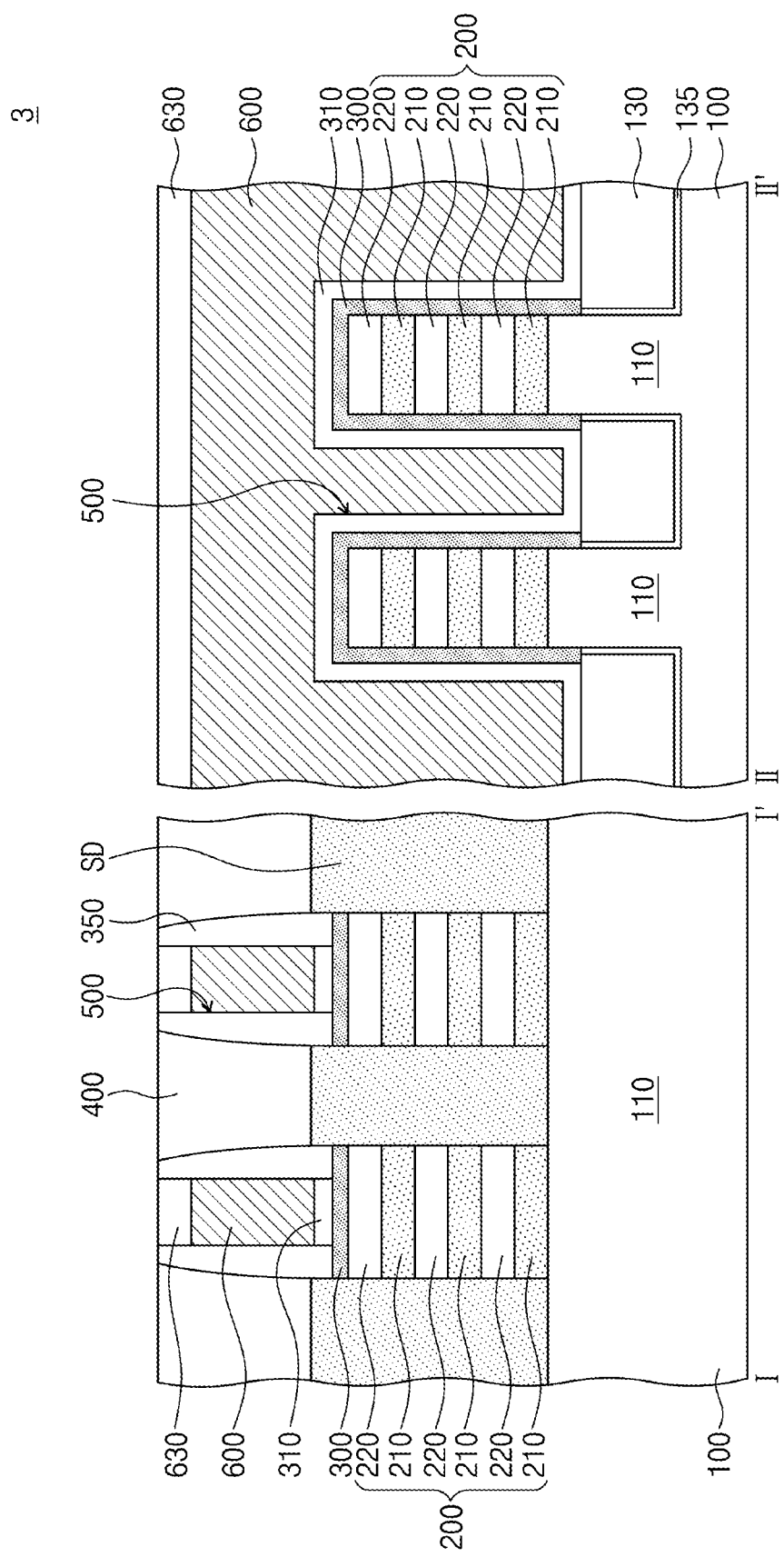

FIGS. 4F and 4G are cross-sectional views corresponding to the lines I-I' and II-II' of FIG. 1 to illustrate a method of manufacturing a semiconductor device, according to some embodiments of the inventive concepts. Hereinafter, the descriptions to the same components and/or features as in the above embodiments will be omitted or mentioned briefly for convenience in explanation.

Referring to FIGS. 4D and 4F, the base active pattern 110, the device isolation patterns 130, the active pattern 200, the capping pattern 300, the insulating pattern 310, the sacrificial gate pattern 320, the gate spacers 350, the source/drain patterns SD and the interlayer insulating layer 400 may be formed on the substrate 100 as described with reference to FIGS. 4A to 4D. However, the process of laterally recessing the sidewalls of the first semiconductor patterns 210 in FIG. 4D may not be performed, and the insulating spacers 250 of FIG. 4D may not be formed.

The sacrificial gate pattern 320 may be removed to form an opening 500 between the gate spacers 350. The opening 500 may expose the insulating pattern 310. The opening 500 may be formed by the etching process described with reference to FIG. 3A.

Referring to FIG. 4G, a gate pattern 600 may be formed in the opening 500. The formation of the gate pattern 600 may be performed by the method described with reference to FIG. 3B. The gate pattern 600 may be provided on the insulating pattern 310 and may be spaced apart from the first and second semiconductor patterns 210 and 220 and the base active pattern 110. The insulating pattern 310 may function as a gate insulating layer. A gate capping pattern 630 may be formed on the gate pattern 600. The manufacture of a semiconductor device 3 may be completed by the aforementioned embodiments.

Figure 5A:
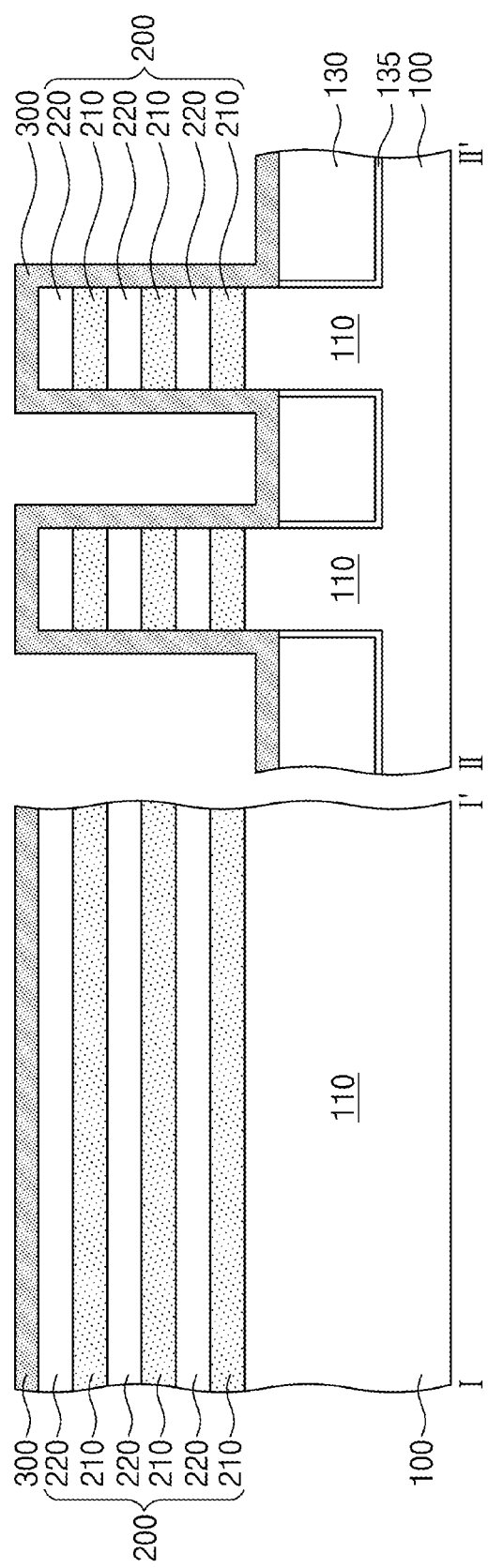
FIGS. 5A to 5H are views illustrating a method of manufacturing a semiconductor device, according to some embodiments of the inventive concept.
Figure 5B:
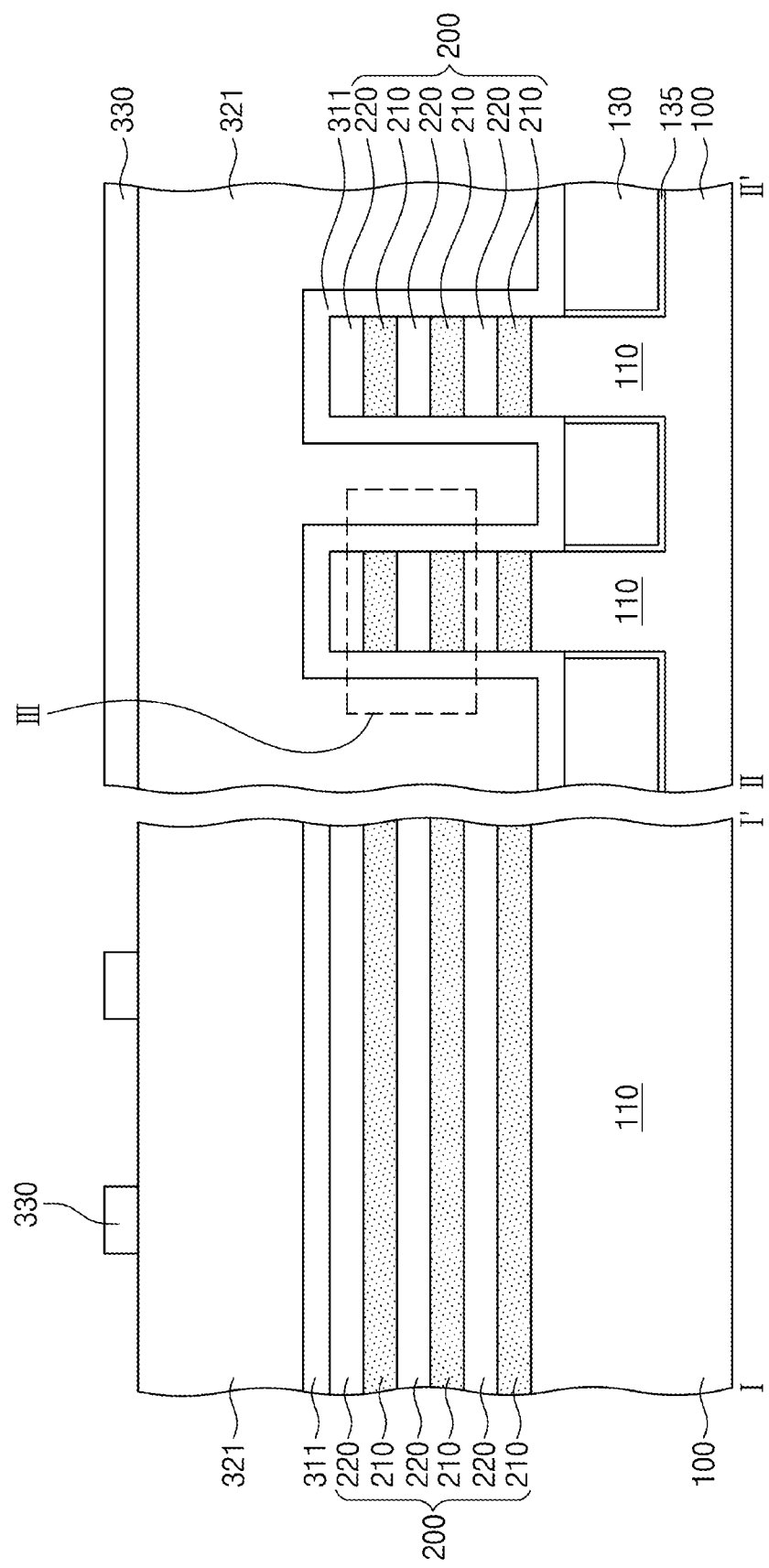
Figure 5C:
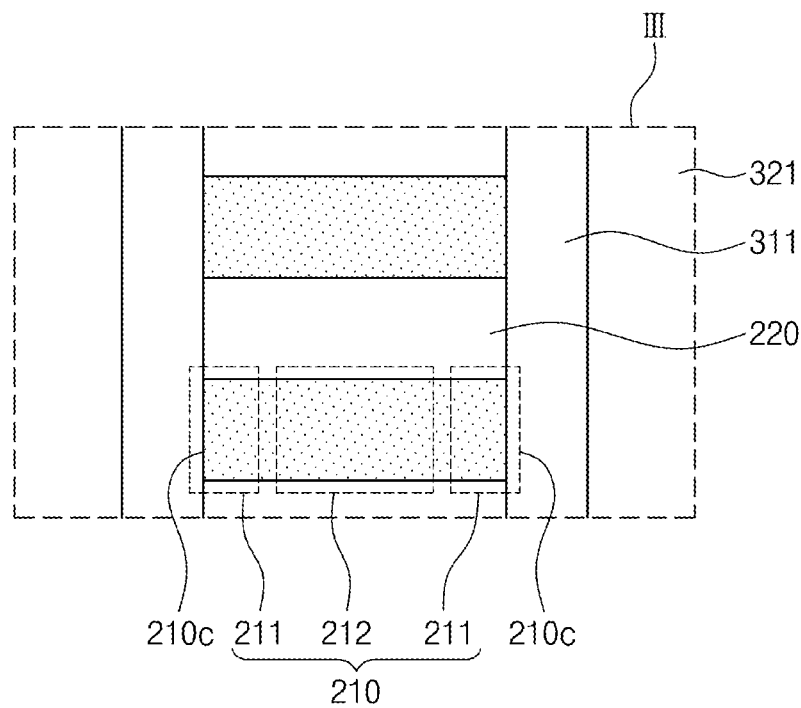

FIGS. 5A to 5H are views illustrating a method of manufacturing a semiconductor device, according to some embodiments of the inventive concepts. FIGS. 5A, 5B and 5D to 5H are cross-sectional views corresponding to the lines I-I' and II-II' of FIG. 1. FIG. 5C is an enlarged view of a region 'III' of FIG. 5B. Hereinafter, the descriptions to the same components and/or features as in the above embodiments will be omitted or mentioned briefly for convenience in explanation. The description of the embodiments of FIGS. 5A to 5H will also refer to FIG. 1.

Referring to FIG. 5A, an active pattern 200 and device isolation patterns 130 may be formed on the substrate 100. A capping pattern 300 may be formed on a top surface and a sidewall of the active pattern 200 and top surfaces of the device isolation patterns 130. The capping pattern 300 may be formed by the method described with reference to FIG. 2C.

Unlike FIG. 5A, the capping pattern 300 may at least partially cover the top surface and the sidewall of the active pattern 200, but may expose the top surfaces of the device isolation patterns 130. In this case, the capping pattern 300 may be formed by the selective epitaxial growth (SEG) process described with reference to FIG. 4A.

Referring to FIGS. 5B and 5C, an insulating layer 311 may be formed on the capping pattern 300. The capping pattern 300 may be oxidized during the process of forming the insulating layer 311. When the formation of the insulating layer 311 is completed, the capping pattern 300 may not remain between the active pattern 200 and the insulating layer 311. Thus, the first portions 211 of the first semiconductor patterns 210 may be in physical contact with the insulating layer 311.

During the process of forming the insulating layer 311, the capping pattern 300 may inhibit or prevent oxidation of the first semiconductor patterns 210. A composition ratio, i.e., a ratio of elements or components, of the first portions 211 of the first semiconductor patterns 210 may be substantially equal to a composition ratio of the second portions 212 of the first semiconductor patterns 210.

A sacrificial gate layer 321 and a mask pattern 330 may be sequentially formed on the insulating layer 311.

Figure 5D:
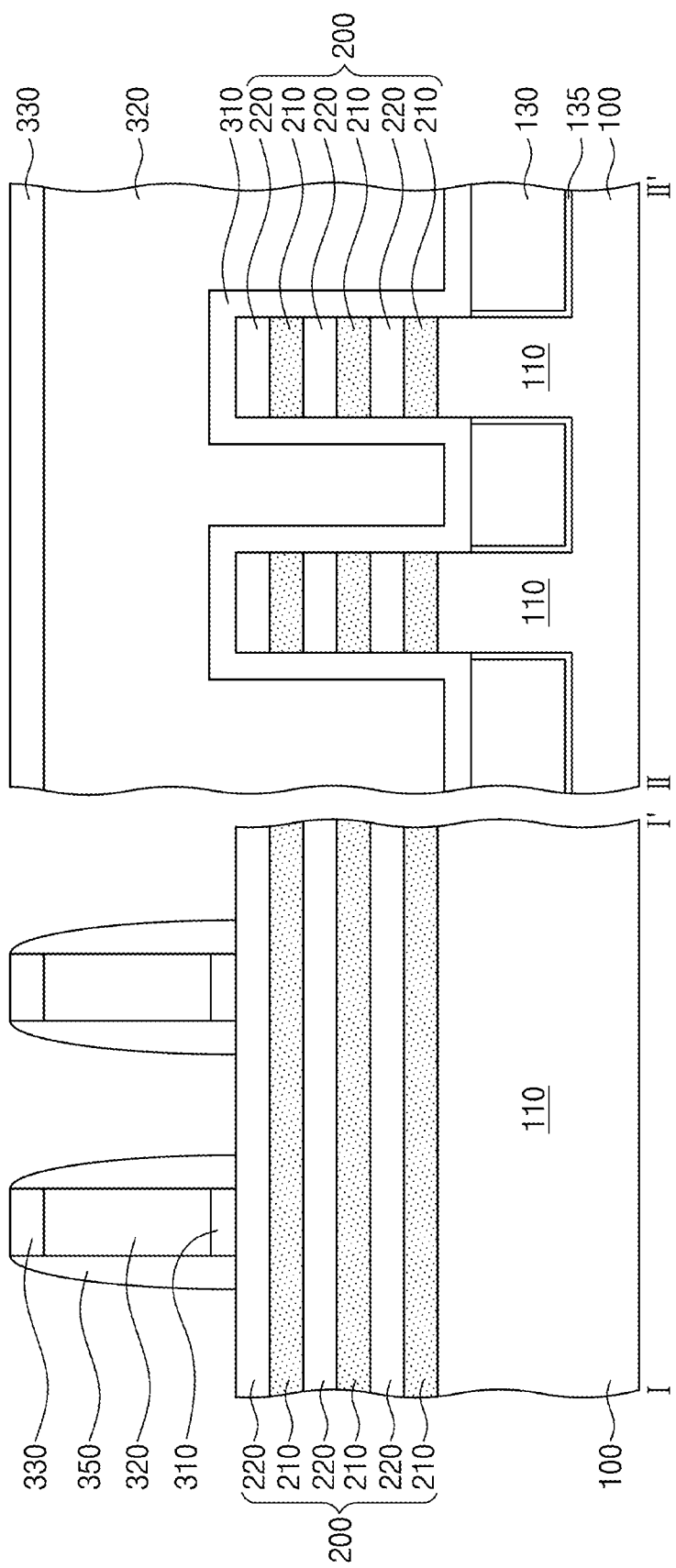

Referring to FIG. 5D, the sacrificial gate layer 321 and the insulating layer 311 may be patterned to form a sacrificial gate pattern 320 and an insulating pattern 310. The formation of the sacrificial gate pattern 320 may include etching the sacrificial gate layer 321 exposed by the mask pattern 330. The formation of the insulating pattern 310 may include etching the insulating layer 311 exposed by the mask pattern 330. Gate spacers 350 may be formed on both sidewalls of the sacrificial gate pattern 320 on the active pattern 200. Because the capping pattern 300 is removed as described with reference to FIG. 5B, the insulating pattern 310 may be in direct physical contact with the active pattern 200 and the device isolation patterns 130.

Figure 5E:
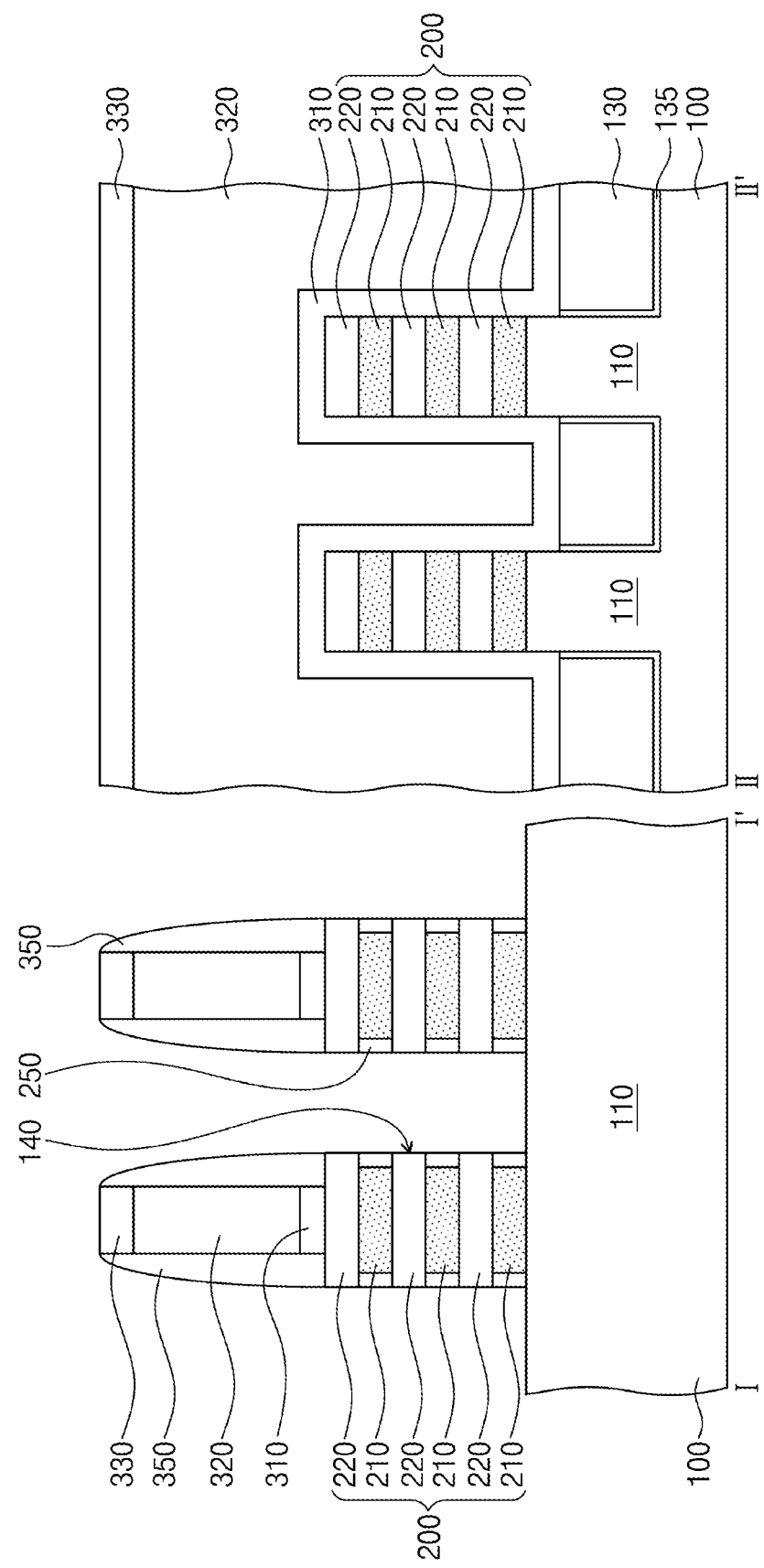

Referring to FIG. 5E, an etching process may be performed on the active pattern 200 to form recess portions 140 in the active pattern 200. The etching process may include removing the active pattern 200 exposed by the mask pattern 330 and the gate spacers 350. Portions of the first semiconductor patterns 210 may be laterally removed, and, thus, sidewalls of the first semiconductor patterns 210 may be laterally recessed. Insulating spacers 250 may be formed on the recessed sidewalls of the first semiconductor patterns 210 and under the second semiconductor patterns 220.

Figure 5F:
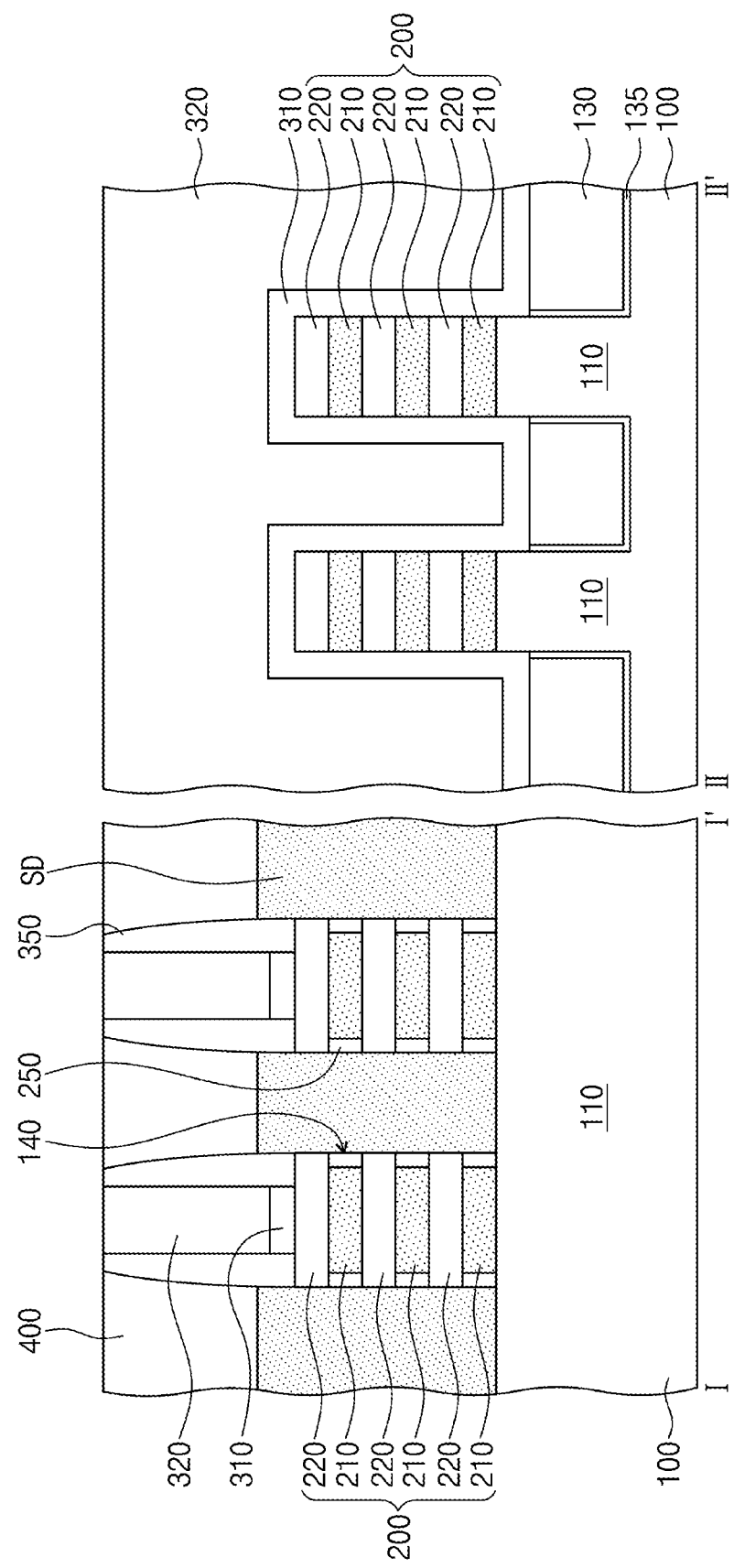

Referring to FIG. 5F, source/drain patterns SD may be formed in the recess portions 140. An interlayer insulating layer 400 may be formed to at least partially cover the source/drain patterns SD. The mask pattern 330 may be removed in the process of forming the interlayer insulating layer 400.

Figure 5G:
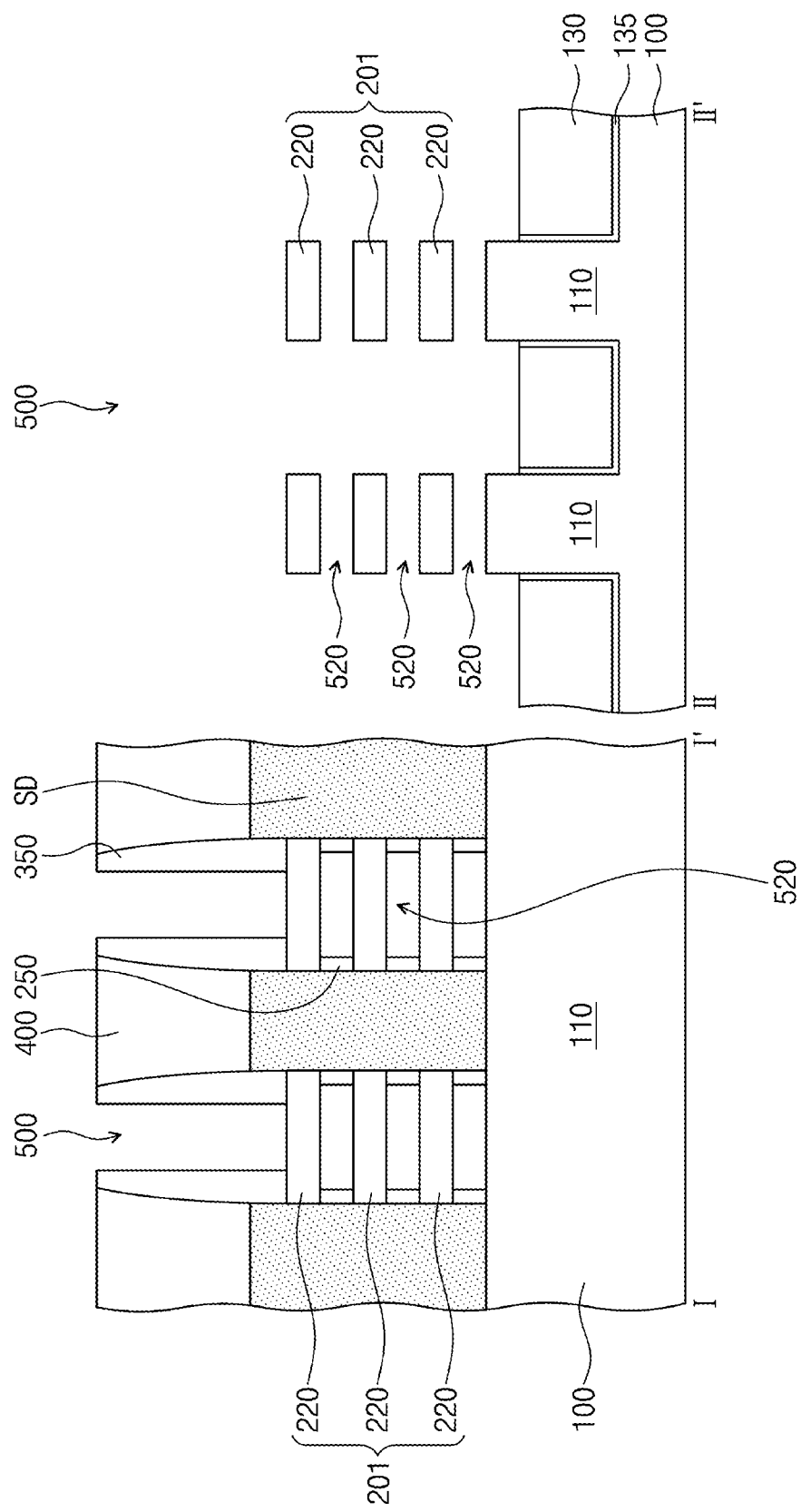

Referring to FIG. 5G, the sacrificial gate pattern 320 and the insulating pattern 310 may be removed to form an opening 500 between the gate spacers 350. The opening 500 may expose the active pattern 200 and the device isolation patterns 130. The removal of the insulating pattern 310 and the removal of the sacrificial gate pattern 320 may be performed by a single process or different processes. The first semiconductor patterns 210 may be removed by an etching process to form opening regions 520. After formation of the opening regions 520, an active pattern 201 may include the second semiconductor patterns 220 spaced apart from each other.

Figure 5H:
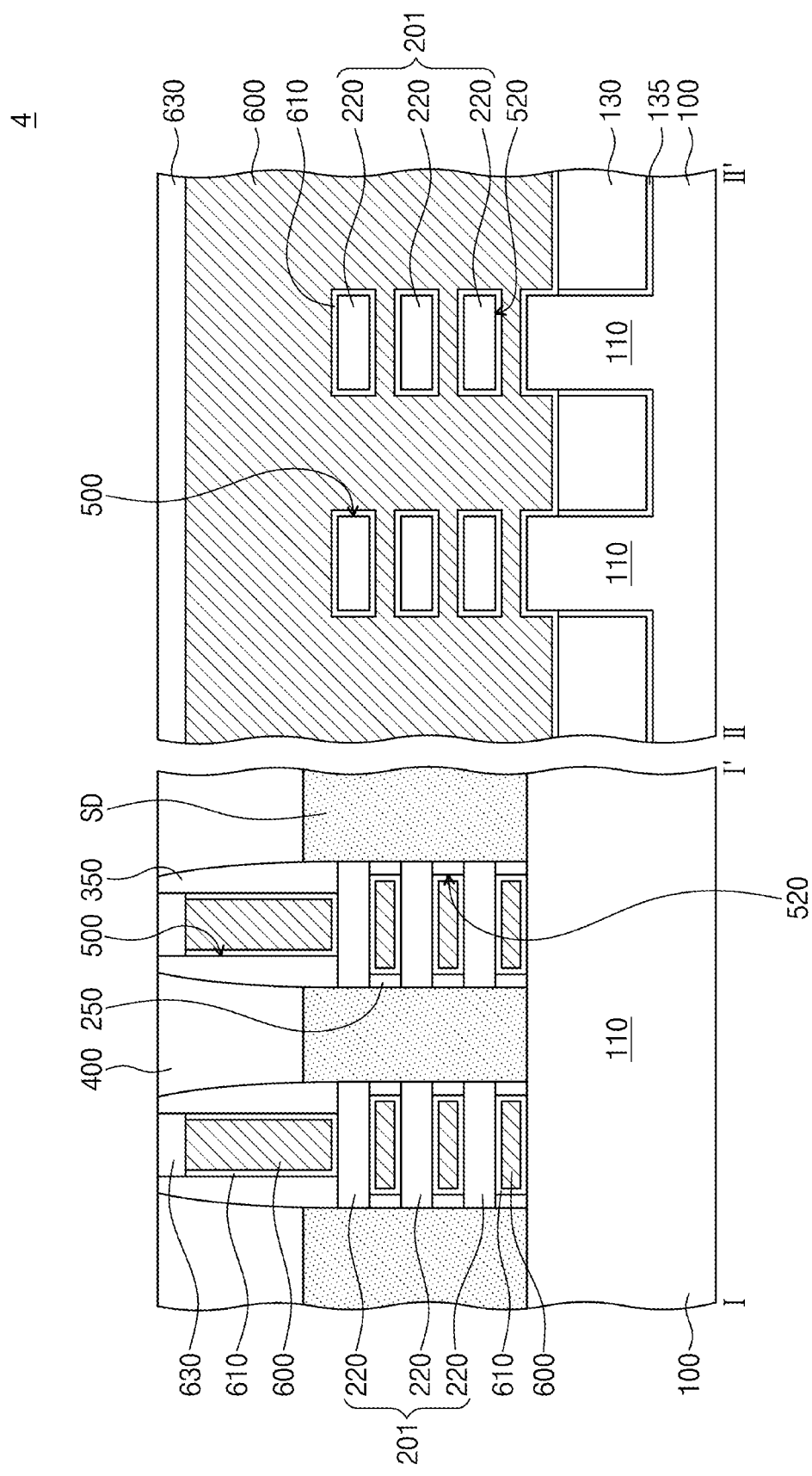

Referring to FIG. 5H, the gate insulating pattern 610 and the gate pattern 600 may be formed in the opening 500 and the opening regions 520. Thus, the manufacture of a semiconductor device 4 may be completed. According to some embodiments, the semiconductor device 4 may not include the capping pattern.

Figure 5I:
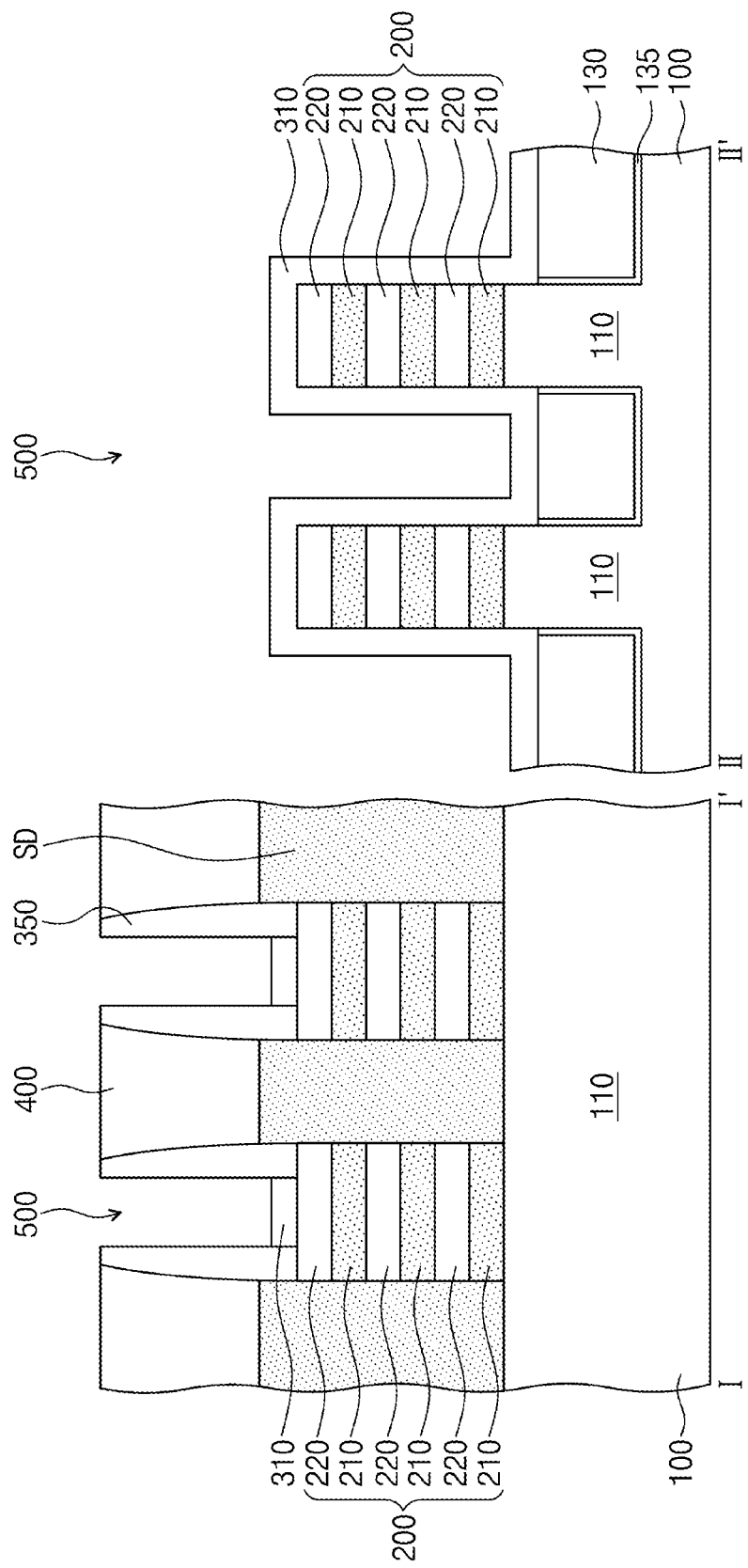
FIGS. 5I and 5J are views illustrating a method of manufacturing a semiconductor device, according to some embodiments of the inventive concept.
Figure 5J:
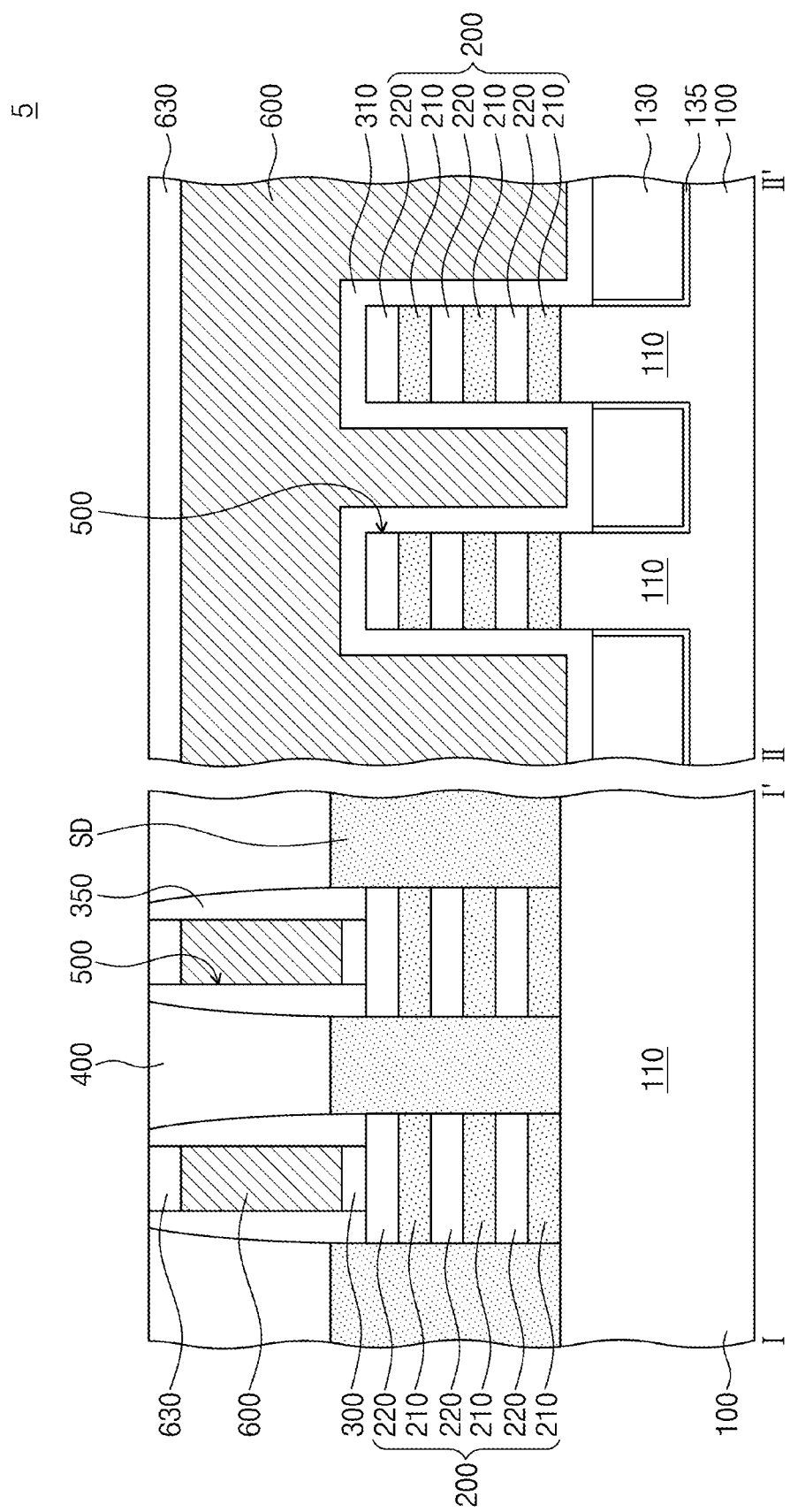

FIGS. 5I and 5J are views illustrating a method of manufacturing a semiconductor device, according to some embodiments of the inventive concepts. FIGS. 5I and 5J are cross-sectional views corresponding to the lines I-I' and II-II' of FIG. 1. Hereinafter, the descriptions to the same components and/or features as in the above embodiments will be omitted or mentioned briefly for convenience in explanation.

Referring to FIGS. 5F and 5I, the base active pattern 110, the device isolation patterns 130, the active pattern 200, the insulating pattern 310, the sacrificial gate pattern 320, the gate spacers 350, the source/drain patterns SD and the interlayer insulating layer 400 may be formed on the substrate 100 as described with reference to FIGS. 5A to 5F. As described with reference to FIG. 5B, the capping pattern 300 may be oxidized during the process of forming the insulating layer 311 and, thus, may not remain after the process of forming the insulating layer 311. However, the process of laterally recessing the sidewalls of the first semiconductor patterns 210 in FIG. 5E may be omitted, and the insulating spacers 250 of FIG. 5E may not be formed.

The sacrificial gate pattern 320 may be removed as illustrated in FIG. 5I, and, thus, an opening 500 may be formed between the gate spacers 350. The opening 500 may expose the insulating pattern 310.

Referring to FIGS. 1 and 5J, a gate pattern 600 may be formed in the opening 500. The formation of the gate pattern 600 may be performed by the method described with reference to FIG. 3B. The gate pattern 600 may be provided on the insulating pattern 310 and may be spaced apart from the first and second semiconductor patterns 210 and 220 and the base active pattern 110. The insulating pattern 310 may function as a gate insulating layer. A gate capping pattern 630 may be formed on the gate pattern 600. The manufacture of a semiconductor device 5 may be completed by the aforementioned embodiments.

According to the embodiments of the inventive concepts, the capping pattern may prevent the semiconductor patterns from being exposed during the process of forming the insulating layer. Thus, oxidation of the semiconductor patterns may be inhibited or prevented. According to the embodiments of the inventive concepts, the semiconductor device may be more easily manufactured. As a result, the reliability of the semiconductor device may be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method of manufacturing a semiconductor device, the method comprising:
   forming an active pattern on a substrate, the active pattern comprising first semiconductor patterns and second semiconductor patterns, which are alternately stacked;
   forming a device isolation pattern exposing an upper portion of the active pattern on the substrate;
   forming a capping pattern on a top surface and a sidewall of the active pattern;
   performing a deposition process on the capping pattern to form an insulating layer, the capping pattern disposed between the insulating layer and the top surface of the active pattern and between the insulating layer and the sidewall of the active pattern; and
   forming a sacrificial gate pattern intersecting the active pattern on the insulating layer,
   wherein the capping pattern has a crystalline structure, and is in physical contact with sidewalls of the first semiconductor patterns and sidewalls of the second semiconductor patterns.

2. The method of claim 1, further comprising:
   forming gate spacers on the capping pattern at both sides of the sacrificial gate pattern.

3. The method of claim 1,
   wherein the forming of the capping pattern is performed by a selective epitaxial growth process, and the capping pattern exposes a top surface of the device isolation pattern.

4. The method of claim 3, wherein the insulating layer is in physical contact with the top surface of the device isolation pattern.

5. The method of claim 1, wherein the forming of the sacrificial gate pattern comprises:
   forming a sacrificial gate layer on the insulating layer;
   forming a mask pattern on the sacrificial gate layer; and
   etching the sacrificial gate layer using the mask pattern as an etch mask,
   wherein the etching of the sacrificial gate layer is performed until a top surface of the capping pattern is exposed.

6. The method of claim 1, further comprising:
   forming an interlayer insulating layer on the sacrificial gate pattern;
   removing the sacrificial gate pattern and a portion of the interlayer insulating layer to form an opening, such that the insulating layer and a remaining portion of the interlayer insulating layer are exposed; and
   forming a gate pattern in the opening on the insulating layer.

7. The method of claim 6, wherein the insulating layer is between the capping pattern and the gate pattern.

8. The method of claim 1, wherein the insulating layer has an oxygen content ratio higher than that of the capping pattern.

9. The method of claim 8, wherein the capping pattern is on the first semiconductor patterns during the deposition process for forming the insulating layer, and
   wherein at least a portion of the capping pattern is oxidized during the formation of the insulating layer.

10. A method of manufacturing a semiconductor device, the method comprising:
    forming an active pattern on a substrate, the active pattern comprising first semiconductor patterns and second semiconductor patterns, which are alternately stacked;
    forming a capping pattern on a top surface and a sidewall of the active pattern;
    performing a deposition process on the capping pattern to form an insulating layer; and
    forming a sacrificial gate pattern intersecting the active pattern on the insulating layer;
    forming gate spacers on the capping pattern at both sides of the sacrificial gate pattern;
    removing the sacrificial gate pattern and the insulating layer to form an opening between the gate spacers; and
    performing an etching process in the opening, such that a portion of the active pattern is exposed,
    wherein the capping pattern remains between the active pattern and the gate spacers after the etching process, and
    wherein the capping pattern has a crystalline structure, and is in physical contact with sidewalls of the first semiconductor patterns and sidewalls of the second semiconductor patterns.

11. The method of claim 10, further comprising:
    forming a gate insulating pattern in the opening,
    wherein the gate insulating pattern is in contact with the portion of the active pattern and an inner sidewall of the capping pattern.

12. The method of claim 10, further comprising:
    etching the first semiconductor patterns to form empty regions between the second semiconductor patterns; and
    forming a gate pattern in the empty regions.

13. A method of manufacturing a semiconductor device, the method comprising:
    forming an active pattern protruding from a substrate, the active pattern comprising first semiconductor patterns and second semiconductor patterns, which are alternately stacked;
    forming a device isolation pattern exposing an upper portion of the active pattern on the substrate;
    forming a capping pattern on a top surface and a sidewall of the active pattern, the capping pattern exposing a top surface of the device isolation pattern;
    forming an insulating layer on the capping pattern and the top surface of the device isolation pattern; and
    forming a sacrificial gate pattern intersecting the active pattern on the insulating layer, wherein the capping pattern is in physical contact with first sidewalls of the first semiconductor patterns and second sidewalls of the second semiconductor patterns.

14. The method of claim 13, wherein the insulating layer has an oxygen content ratio higher than that of the capping pattern.

15. The method of claim 14, wherein the capping pattern does not include oxygen and germanium.

16. The method of claim 15, wherein each of the first and second semiconductor patterns comprises:
   first portions in physical contact with the capping pattern; and
   a second portion between the first portions,
   wherein a composition ratio of the first portions is substantially equal to a composition ratio of the second portion after the forming of the insulating layer.

17. The method of claim 14, wherein the capping pattern comprises a semiconductor material and has a crystalline structure.

18. The method of claim 13, further comprising:
   forming an interlayer insulating layer on the sacrificial gate pattern;
   removing the sacrificial gate pattern and a portion of the interlayer insulating layer to form an opening, such that the insulating layer and a remaining portion of the interlayer insulating layer are exposed; and
   forming a gate pattern in the opening on the insulating layer,
   wherein the insulating layer comprises a gate insulating layer.

19. The method of claim 18, further comprising:
   forming recess portions in the active pattern at both sides of the sacrificial gate pattern; and
   forming source/drain patterns in the recess portions,
   wherein the source/drain patterns are in contact with third sidewalls of the first semiconductor patterns, fourth sidewalls of the second semiconductor patterns, and outer sidewalls of the capping pattern.

20. The method of claim 13, wherein the forming of the insulating layer comprises: performing a deposition process,
   wherein the capping pattern is on the first semiconductor patterns during the deposition process, and
   wherein at least a portion of the capping pattern is oxidized during the forming of the insulating layer.

* * * * *